US010950612B2

(12) United States Patent
Kim et al.

(10) Patent No.: US 10,950,612 B2
(45) Date of Patent: Mar. 16, 2021

(54) THREE DIMENSIONAL SEMICONDUCTOR MEMORY WITH RESIDUAL MEMORY LAYER

(71) Applicant: SAMSUNG ELECTRONICS CO., LTD., Suwon-si (KR)

(72) Inventors: Sunggil Kim, Yongin-si (KR); Sangsoo Lee, Seoul (KR); Seulye Kim, Seoul (KR); Hongsuk Kim, Yongin-si (KR); Jintae Noh, Yongin-si (KR); Ji-Hoon Choi, Seongnam-si (KR); Jaeyoung Ahn, Seongnam-si (KR); Sanghoon Lee, Seongnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 84 days.

(21) Appl. No.: 15/981,928

(22) Filed: May 17, 2018

(65) Prior Publication Data

US 2019/0081054 A1 Mar. 14, 2019

(30) Foreign Application Priority Data

Sep. 11, 2017 (KR) .................. 10-2017-0116114

(51) Int. Cl.
*H01L 27/11556* (2017.01)
*H01L 27/11582* (2017.01)
*H01L 29/78* (2006.01)
*G11C 16/04* (2006.01)
*H01L 29/66* (2006.01)
*H01L 27/1157* (2017.01)
*H01L 27/11565* (2017.01)
*H01L 27/11573* (2017.01)
*H01L 27/11575* (2017.01)

(52) U.S. Cl.
CPC .... *H01L 27/11556* (2013.01); *G11C 16/0441* (2013.01); *G11C 16/0483* (2013.01); *H01L 27/1157* (2013.01); *H01L 27/11565* (2013.01); *H01L 27/11573* (2013.01); *H01L 27/11575* (2013.01); *H01L 27/11582* (2013.01); *H01L 29/66734* (2013.01); *H01L 29/7813* (2013.01)

(58) Field of Classification Search
CPC ......... H01L 27/11556; H01L 29/66734; H01L 29/7813; H01L 27/11582
See application file for complete search history.

(56) References Cited

U.S. PATENT DOCUMENTS 8,883,576 B2 11/2014 Lee et al.
9,099,527 B2 8/2015 Yoo
(Continued)

*Primary Examiner* — Allen L Parker
*Assistant Examiner* — Wasiul Haider
(74) *Attorney, Agent, or Firm* — Volentine, Whitt & Francos, PLLC

(57) ABSTRACT

A semiconductor memory device has a plurality of gates vertically stacked on a top surface of a substrate, a vertical channel filling a vertical hole that extends vertically through the plurality of gates, and a memory layer in the vertical hole and surrounding the vertical channel. The vertical channel includes a bracket-shaped lower portion filling part of a recess in the top of the substrate and an upper portion extending vertically along the vertical hole and connected to the lower channel. At least one end of an interface between the lower and upper portions of the vertical channel is disposed at a level not than that of the top surface of the substrate.

20 Claims, 38 Drawing Sheets

(56) References Cited

U.S. PATENT DOCUMENTS

| | | |
|---|---|---|
| 9,431,416 B2 | 8/2016 | Nam et al. |
| 9,589,981 B2 | 3/2017 | Nishikawa et al. |
| 9,653,472 B2 | 5/2017 | Lee et al. |
| 2012/0068255 A1* | 3/2012 | Lee .................. H01L 27/11582 |
| | | 257/324 |
| 2013/0134492 A1 | 5/2013 | Yang et al. |
| 2017/0110470 A1* | 4/2017 | Rabkin ............. H01L 27/11582 |
| 2017/0117222 A1 | 4/2017 | Kim et al. |
| 2019/0027489 A1* | 1/2019 | Orimoto ........... H01L 27/11582 |

* cited by examiner

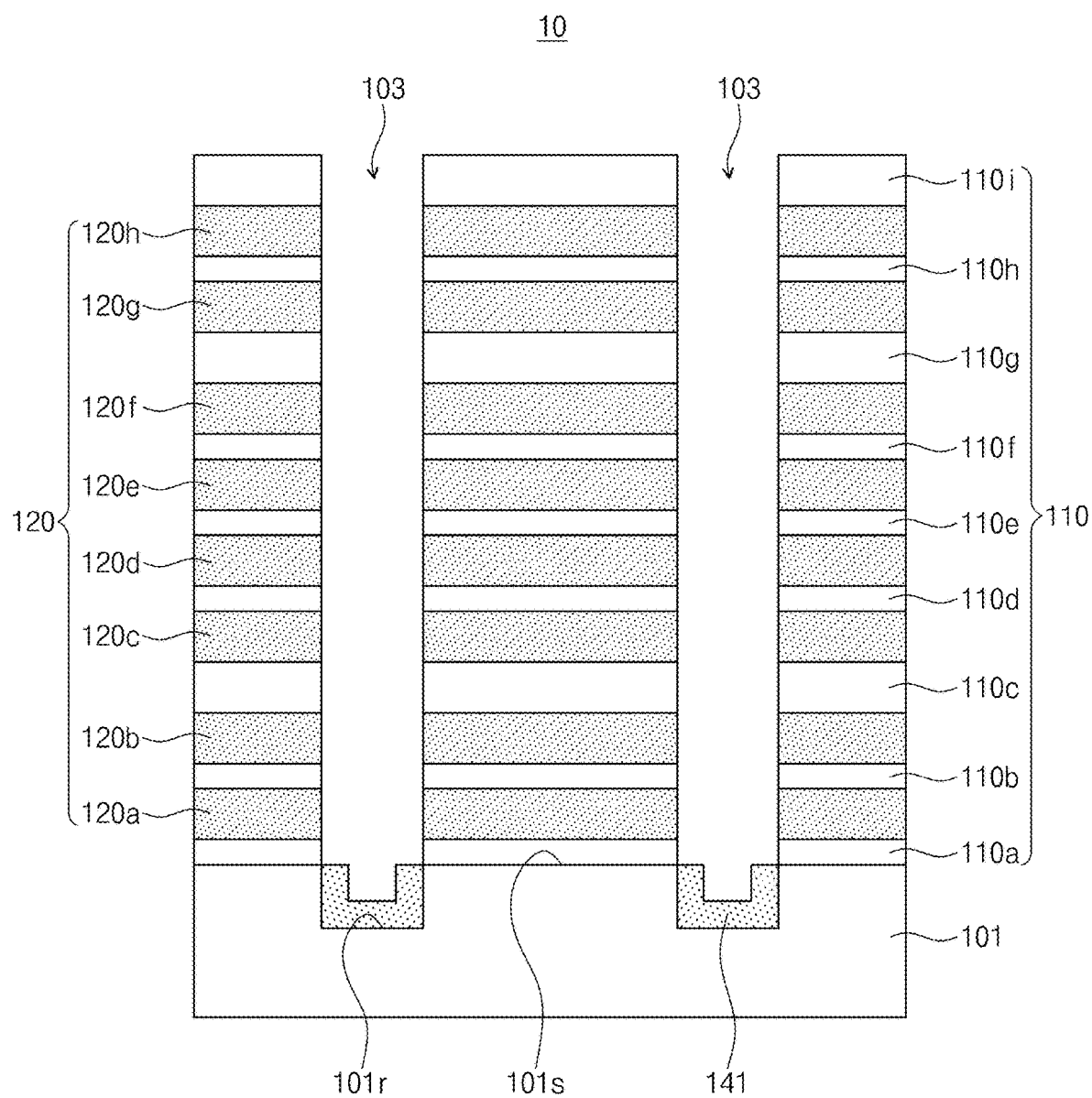

THREE DIMENSIONAL SEMICONDUCTOR MEMORY WITH RESIDUAL MEMORY LAYER

PRIORITY STATEMENT

This U.S. nonprovisional patent application claims priority under 35 U.S.C § 119 of Korean Patent Application No. 10-2017-0116114 filed on Sep. 11, 2017, the entire contents of which are hereby incorporated by reference.

BACKGROUND

The present inventive concept relates to a semiconductor device. More particularly, the inventive concept relates to a three-dimensional semiconductor memory device and to a method of fabricating the same.

Semiconductor devices are considered an important part of the electronics industry because of their small size, multi-functionality, and/or low fabrication cost. High-performance and low-cost semiconductor devices have been increasingly in demand to meet the needs of today's electronics industry. To satisfy the above requirements, semiconductor devices are becoming increasingly integrated.

The integration of a typical two-dimensional semiconductor memory device is primarily determined by an area occupied by a unit memory cell of the device. In addition, the memory cells of a semiconductor device include patterns constituting, for example, a circuit pattern. Therefore, the degree of integration of the typical semiconductor memory device can be greatly affected by technology for forming fine patterns. However, the equipment used to fabricate semiconductor memory devices is expensive to procure, operate and maintain. Equipment cost, therefore, imposes limitations in increasing the integration of semiconductor memory devices. Three-dimensional semiconductor memory devices having three-dimensionally arranged memory cells have been proposed to overcome the limitations in the degree of integration that can be attained by two-dimensional semiconductor memory devices.

SUMMARY

According to the present inventive concept, there are provided examples of a semiconductor memory device comprising a substrate having a top surface and a recess therein defining an opening in the top surface, a plurality of gates vertically stacked on the top surface of the substrate, a vertical channel occupying a vertical hole that extends vertically through the plurality of gates, and a memory layer in the vertical hole and surrounding the vertical channel. The vertical channel includes a lower channel occupying part of the recess and having a vertical cross section in the form of an upwardly facing bracket, and an upper channel vertically extending along the vertical hole and connected to the lower channel. The lower and upper channels constitute a connection structure having an interface along which the lower channel and the upper channel meet and through which a conductive path between the lower channel and the upper channel is established, the interface being situated no higher than the top surface of the substrate.

According to the present inventive concept, there are provided examples of a semiconductor memory device comprising a substrate having a top surface, a gate stack in which a plurality of gates are vertically stacked on the top surface of the substrate, an upper channel extending vertically through the gate stack, a lower channel extending from the upper channel to below the top surface of the substrate, the lower channel having a vertical cross section in the form of an upwardly facing bracket, and a memory layer in the gate stack and surrounding the upper channel. Respective portions of the upper channel and the lower channel constitute a connection structure having an interface along which the upper channel and the lower channel meet such that the upper channel and the lower channel together form a vertical channel, the interface being situated at a level not higher than that of the top surface of the substrate.

According to the present inventive concept, there are provided examples of a semiconductor memory device comprising a substrate having a top surface, a gate stack including gates disposed one above another on the top surface of the substrate, a vertical channel having an upper portion of semiconductor material and a lower portion of semiconductor material, and a memory layer structure in the gate stack. The upper portion of the vertical channel extends vertically through the gate stack. The memory layer structure surrounds the upper portion of the vertical channel. The lower portion of the vertical channel is disposed in the substrate and is in the form of a pot so as to have a bottom wall and a sidewall projecting upwardly from the bottom wall, the sidewall having a top surface in the form of a rim and an inner surface. The upper portion of the vertical channel and the lower portion of the vertical channel have an interface along which the upper portion of the vertical channel and the lower portion of the vertical channel meet and across which a conductive path is established in the device, at least one end of the interface being located no higher than a plane that coincides with the top surface of the substrate.

According to examples of the present inventive concept, a method of fabricating a semiconductor memory device may comprise: forming a vertical hole that vertically penetrates a plurality of layers stacked on a substrate and exposes the substrate; forming a recess that is spatially connected to the vertical hole and is recessed below a top surface of the substrate; forming a bracket-shaped lower channel in the recess by a cyclical process in which a deposition process and an etching process are combined; forming in the vertical hole a memory layer that extends toward the lower channel; and forming in the vertical hole an upper channel that extends along the memory layer to come into connection with the lower channel. The deposition process may comprise forming the lower channel that partially fills the recess. The etching process may comprise removing a deposition substance formed in the vertical hole after the deposition process.

BRIEF DESCRIPTION OF THE DRAWINGS

FIGS. 2A to 2P illustrate examples of a method of fabricating semiconductor memory devices according to the present inventive concept, wherein FIGS. 2A, 2B, and 2C are cross-sectional views of a semiconductor memory device during the course its manufacture, FIGS. 2L, 2M, 2N, 2O and 2P are also cross-sectional views of the device during the course its manufacture.

FIGS. 4A to 4E illustrate another example of a method of fabricating a semiconductor memory device according to the present inventive concept, wherein FIGS. 4A, 4C and 4E are cross-sectional views of the device during the course of its manufacture, and FIGS. 4B and 4D are enlargements of portions of the cross-sectional views of FIGS. 4A and 4C, respectively.

FIGS. 6A to 6C illustrate another example of a method of fabricating a semiconductor memory device according to the present inventive concept, wherein FIGS. 6A, 6B and 6C are cross-sectional views of the device during the course of its manufacture.

DETAILED DESCRIPTION

Semiconductor memory devices and methods of fabricating the same will be hereinafter described in detail in conjunction with the accompanying drawings.

Figure 1A:
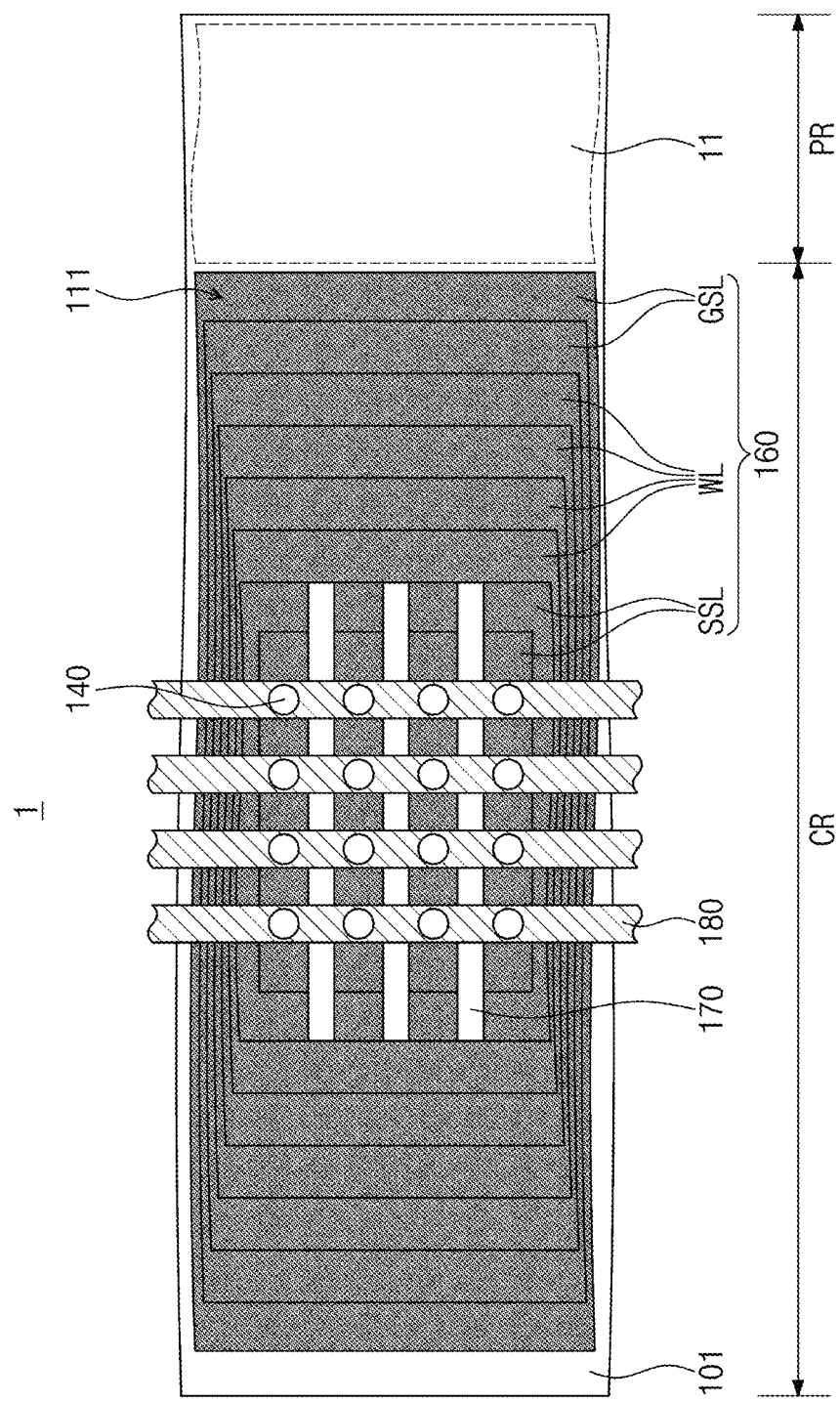
FIG. 1A is a plan view of a basic example of a semiconductor memory device according to the present inventive concept.
Figure 1B:
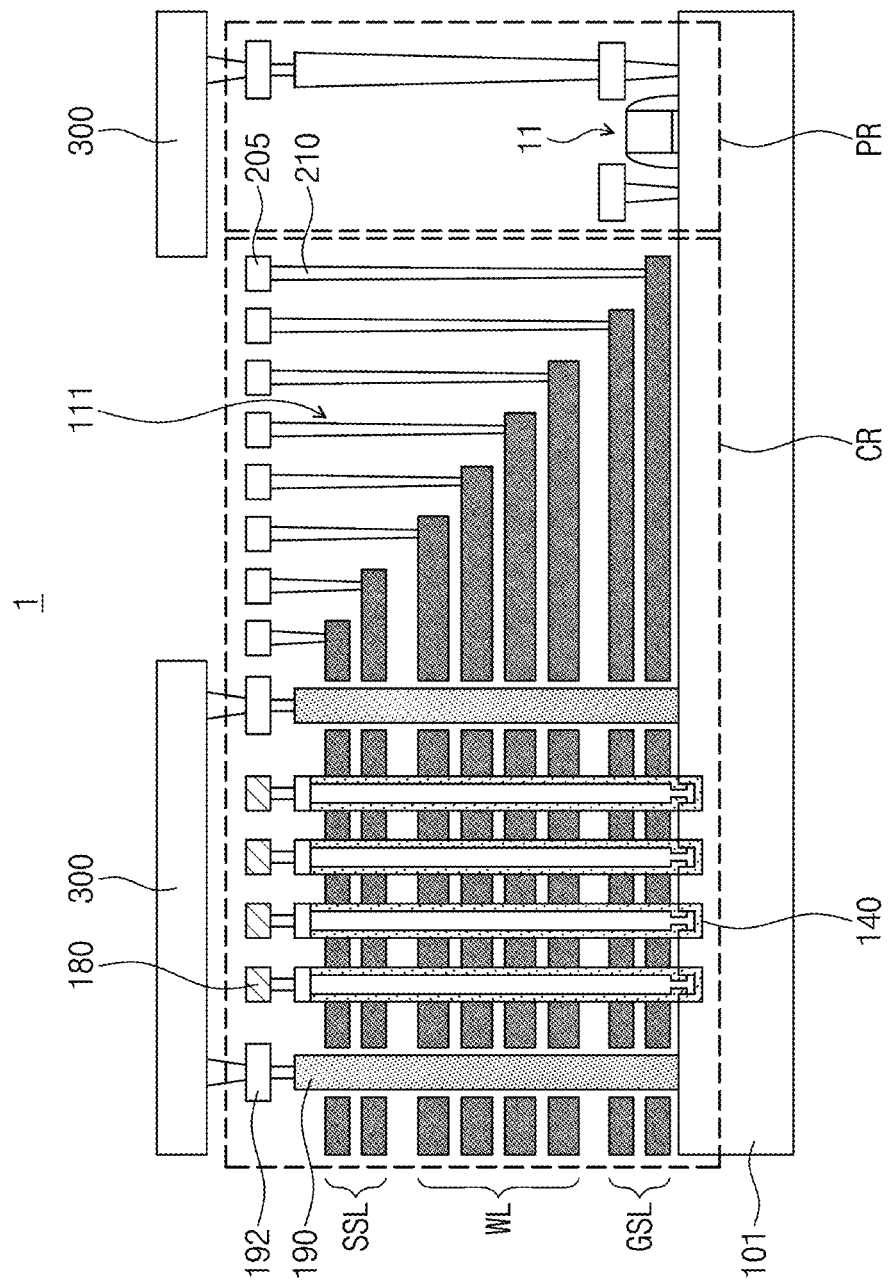
FIG. 1B is a cross-sectional view of the basic example of the semiconductor memory device of FIG. 1A, according to the present inventive concept.

FIG. 1A is a plan view of an example of a semiconductor memory device according to the present inventive concept. FIG. 1B is a cross-sectional view of the semiconductor memory device.

Referring to FIGS. 1A and 1B, a semiconductor memory device 1 may include a cell region CR and a peripheral region PR. The cell region CR may include a plurality of vertical channels 140 standing vertically on a substrate 101, a plurality of gates 160 stacked alongside the vertical channels 140, and a plurality of bit lines 180 electrically connected to the vertical channels 140. The substrate 101 may include a semiconductor wafer (e.g., a single crystalline silicon wafer).

The semiconductor memory device 1 may be a vertical NAND Flash memory device. The semiconductor memory device 1 may further include a memory layer, which will be discussed below with reference to FIG. 2P, between the vertical channel 140 and the gates 160. The vertical channel 140 may include a lower channel and an upper channel connected to each other, as discussed below with reference to FIGS. 2J and 2K. The vertical channel 140 may have a tubular shape, and provide a minimized current path. According to the present inventive concept, the vertical channel 140 may be formed by a process in which the thermal budget is minimal.

The gates 160 may constitute a ground select line GSL having a single-layered or double-layered structure adjacent to the substrate 101, a string select line SSL having a single-layered or double-layered structure adjacent to the bit line 180, and word lines WL between the ground select line GSL and the string select line SSL. Each vertical channel 140 may have a bottom end electrically connected to the substrate 101 and a top end electrically connected to a bit line 180.

The gates 160 may be stacked in a pyramid shape, such that two or four sides of the stacked gates 160 may form stepwise structures 111. The gates 160 may have stepwise-stacked end portions that serve as pads in contact with contact plugs 210. The contact plugs 210 may be electrically connected to metal lines 205. Each of common source plugs 190 may penetrate the gates 160 so as to be electrically connected to a common source provided in the substrate 101 and which will be discussed below with reference to FIG. 2P. The common source plug 190 may be electrically connected to a metal line 192. The metal lines 192 and 205 may communicate with external lines 300. As used herein and the description that follows, the term "communicate" means that a circuit or signal lines, e.g., metal lines 192 and 205, may transmit/receive electrical signals to/from another circuit or signal lines, e.g., external lines 300.

The string select line SSL may have a linear shape extending in a direction substantially perpendicular to the longitudinal direction of the bit line 180. The word lines WL and the ground select line GSL may have plate shapes having word line cuts 107. The word line cuts 107 may expose the substrate 101 and extend in a direction substantially perpendicular to the longitudinal direction of the bit line 180.

The peripheral region PR may include a peripheral circuit 11 that communicates with the cell region CR. The peripheral circuit 11 may communicate with the external lines 300. In some examples, the peripheral region PR is provided on at least one side of the cell region CR. The peripheral region PR may be formed substantially simultaneously with the cell region CR.

Figure 1C:
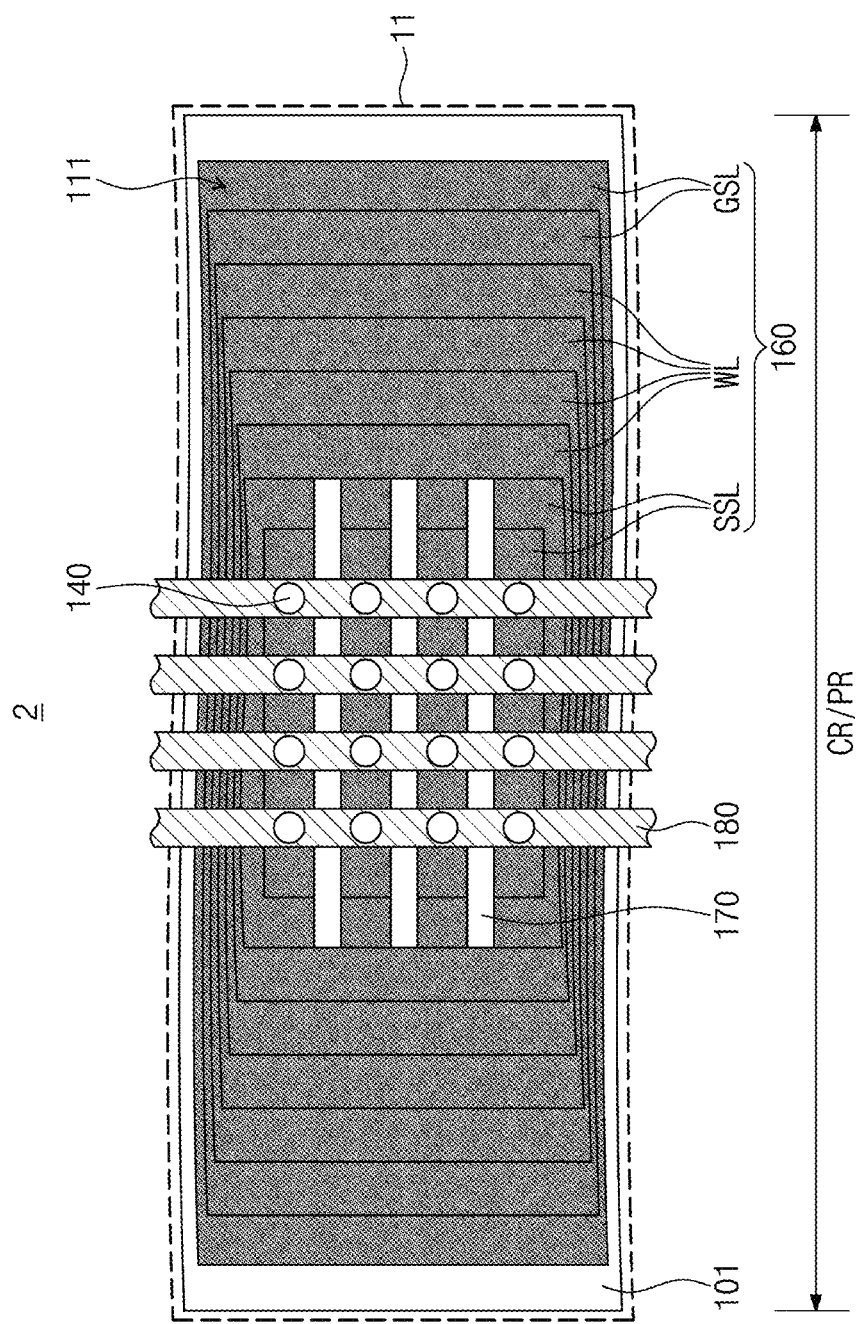
FIG. 1C is a plan view of another basic example of a semiconductor memory device according to the present inventive concept.
Figure 1D:
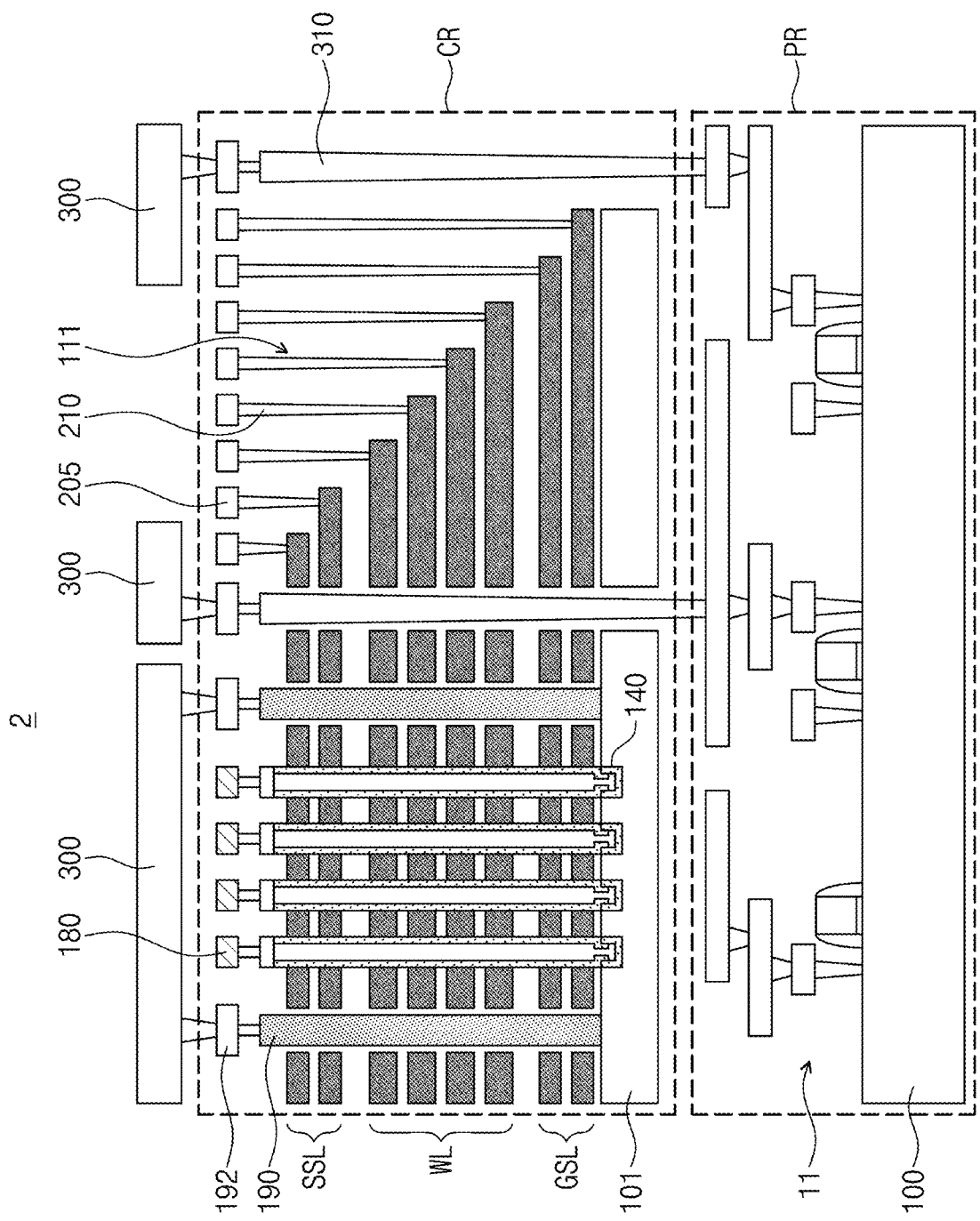
FIG. 1D is a cross-sectional view of the basic example of the semiconductor memory device of FIG. 1C according to the present inventive concept.

FIG. 1C is a plan view of another example of a semiconductor memory device according to the present inventive concept. FIG. 1D is a cross-sectional view of the semiconductor memory device.

Referring to FIGS. 1C and 1D, a semiconductor memory device 2 has a cell over peripheral (COP) structure in which a cell region CR is provided on a peripheral region PR. The substrate 101 may include a semiconductor layer (e.g., a polycrystalline silicon layer). The peripheral region PR may include a peripheral circuit 11 on a substrate 100. The peripheral circuit 11 may communicate with external lines 300 through contact plugs 310 penetrating the cell region CR. The substrate 100 may include a semiconductor wafer (e.g., a single crystalline silicon wafer). Other components may be configured similarly to those of the semiconductor memory device 1.

Methods of fabricating the semiconductor memory devices 1 and 2 according to the inventive concept will next be described in detail. In this description, a method of forming the cell region CR in the semiconductor memory devices 1 and 2 is primarily discussed for the sake of brevity. Unless otherwise stated, the following discussion relates to a method of fabricating the semiconductor memory device 1 shown in FIGS. 1A and 1B, and substantially the same method may be basically employed for manufacturing the semiconductor memory device 2 shown in FIGS. 1C and 1D.

An example of a method of fabricating a semiconductor memory device according to the present inventive concept will be described with reference to FIGS. 2A to 2P.

Figure 2A:
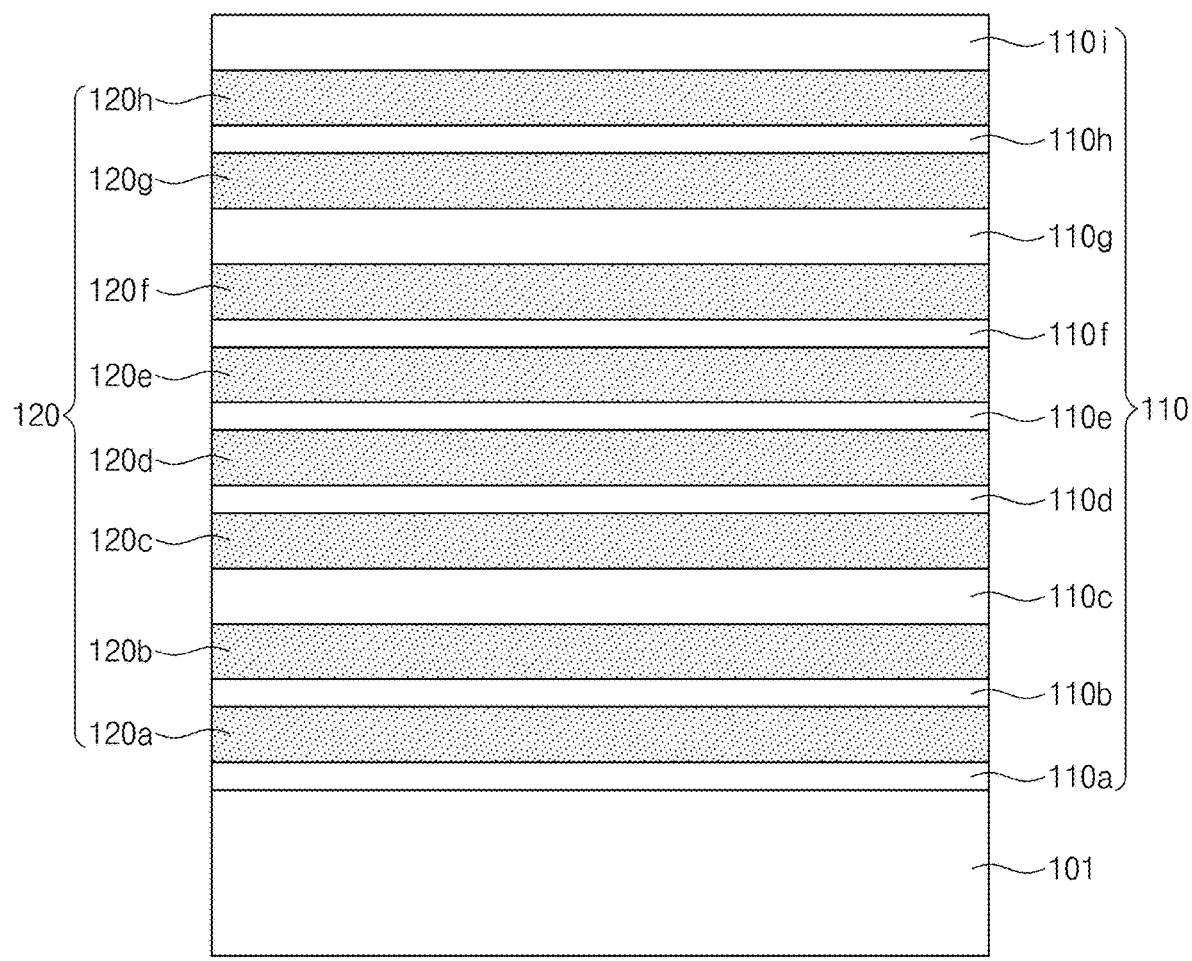

Referring to FIG. 2A, a mold stack 10 may be formed on a substrate 101. The substrate 101 may include a semiconductor wafer such as a single crystalline silicon wafer. Alternatively, when the semiconductor memory device 2 is fabricated, the substrate 101 may include a semiconductor layer such as a single crystalline silicon layer or a polycrystalline silicon layer. The semiconductor layer may be doped with p-type impurities, for example.

A plurality of insulating layers 110 and a plurality of sacrificial layers 120 may be alternately and repeatedly stacked to form the mold stack 10. The insulating layers 110 may include a material having an etch selectivity with respect to the sacrificial layers 120. For example, the insulating layers 110 may be or include silicon oxide layers (e.g., $SiO_2$), and the sacrificial layers 120 may be or include silicon nitride layers (e.g., SiNx).

The insulating layers 110 may include, for example, first to ninth insulating layers 110a to 110i that are sequentially stacked on the substrate 101. The sacrificial layers 120 may include, for example, first to eighth sacrificial layers 120a to 120h that are sequentially stacked on the substrate 101. The first to eighth sacrificial layers 120a to 120h may have substantially the same thicknesses. The first to ninth insulating layers 110a to 110i may have substantially the same thicknesses or different thicknesses. For example, the third and seventh insulating layers 110c and 110g may be formed relatively thicker than other insulating layers 110.

Figure 2B:
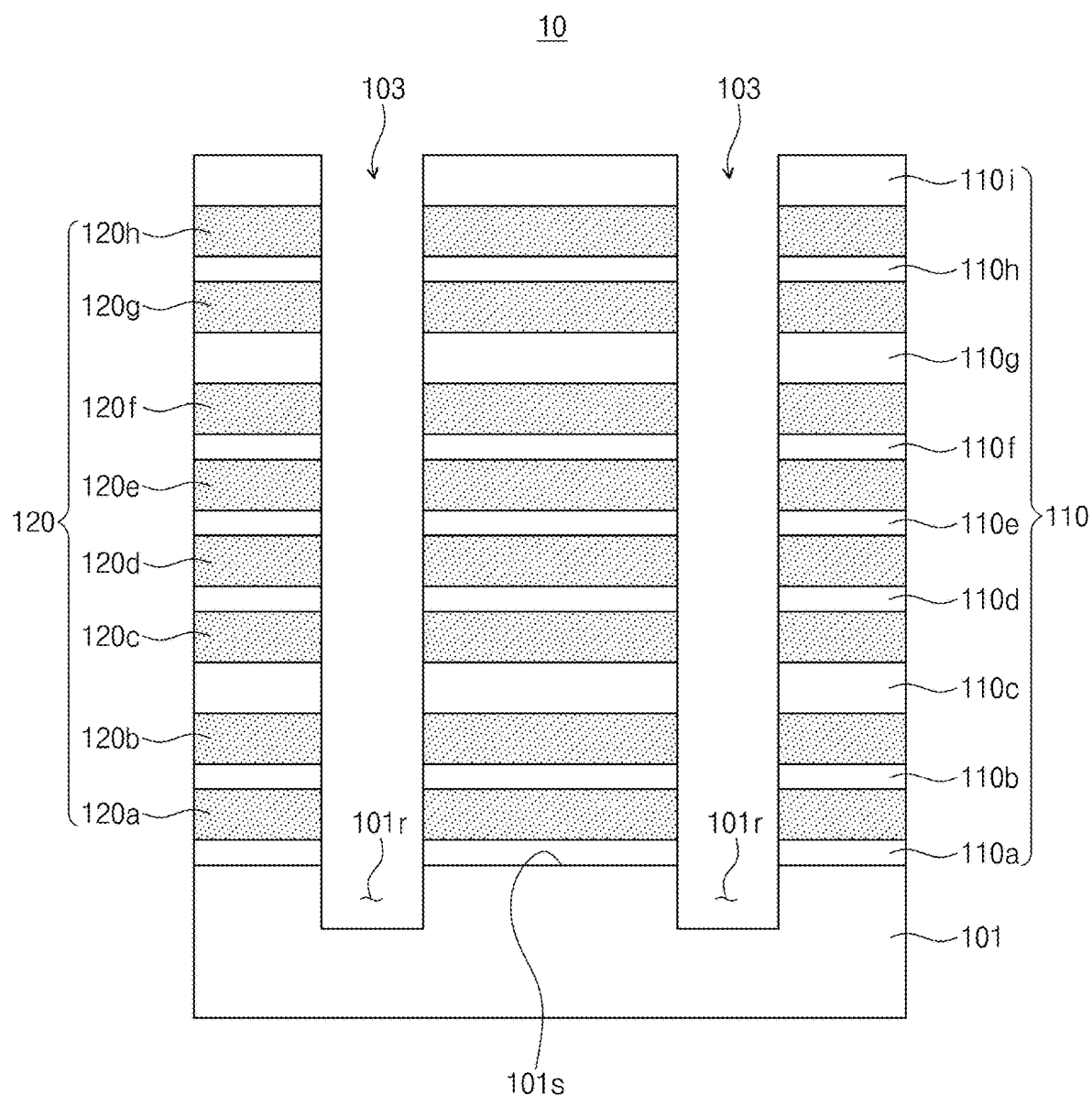

Referring to FIG. 2B, vertical holes 103 may be formed in the mold stack 10. For example, a dry etching process may be performed to form the vertical holes 103 vertically penetrating the mold stack 10 and exposing the substrate 101. When the vertical holes 103 are formed, the substrate 101 may be over-etched to form recesses 101r whose bottoms are located below a top surface 101s of the substrate 101 and which are spatially connected (i.e., open) to the vertical holes 103. Alternatively, after the vertical holes 103 are formed, an etching process may be additionally performed to form the recesses 101r.

Referring to FIG. 2C, lower channels 141 may be formed to partially fill the recesses 101r. Each lower channel 141 (which may be referred to as a lower portion of the vertical channel) may be formed of either an intrinsic semiconductor or a semiconductor having the same conductivity as that of the substrate 101. For example, the lower channel 141 may include p-type silicon or intrinsic silicon. The lower channel 141 may be formed using deposition, epitaxial growth, or laser crystallization. In some examples, a cyclical process in which deposition and etching processes are carried out sequentially at least once may be performed to form the lower channel 141 consisting of single crystalline silicon or polycrystalline silicon.

Figure 2D:
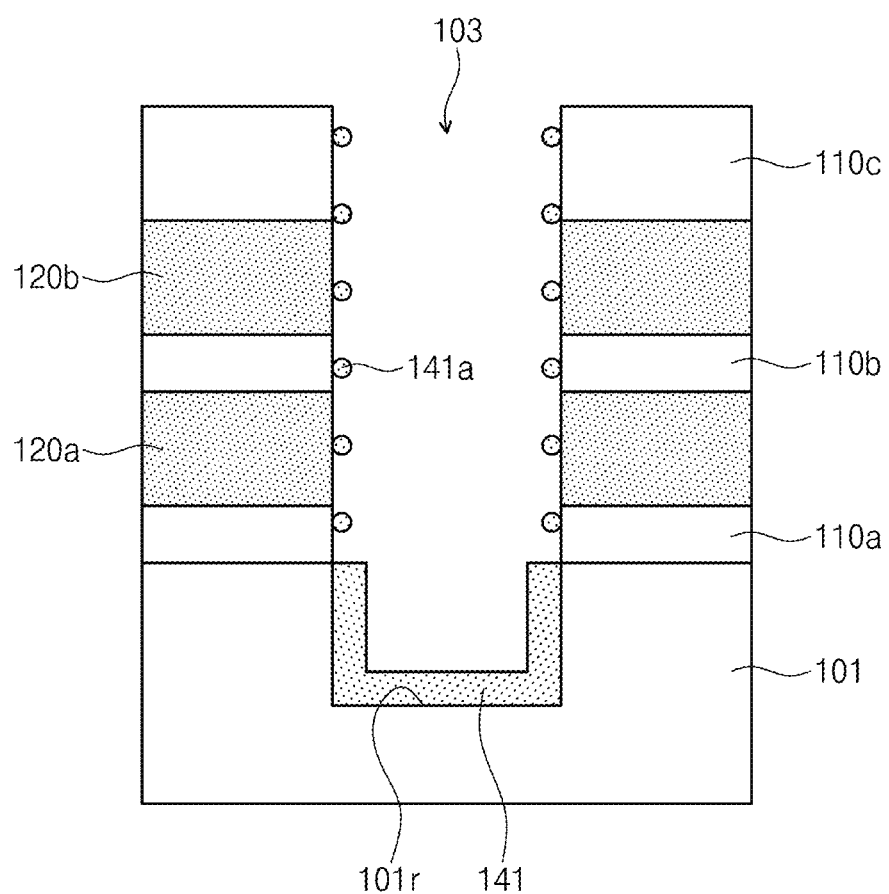
FIGS. 2D and 2E are partial cross-sectional views of the device during the course its manufacture showing a cyclical process.

As an example of the cyclical process, as illustrated in FIG. 2D, a deposition process may be performed to form the lower channel 141. The deposition process may include chemical vapor deposition (CVD) or atomic layer deposition (ALD). The deposition process may use a deposition gas including silicon, such as monosilane (MS), disilane (DS), dichlorosilane (DCS), hexachlorodisilane (HCD), trichlorosilane (TCS), or any combination thereof. Alternatively, a selective epitaxial growth (SEG) process may be used to form the lower channel 141. When the deposition process is employed as in the present example, the lower channel 141 may be formed under lower temperature (e.g., about 600° C. or less) than the known SEG process temperature (e.g., about 800° C. or more). Furthermore, the lower channel 141 may be formed to have relatively uniform thickness regardless of a crystal plane on an inner surface delimiting the recess 101r. However, the present inventive concept does not exclude the possible use of an SEG process. For example, the cyclical process may include an SEG process and an etching process.

The lower channel 141 may have a bracket shape when formed by a deposition process to selectively deposit silicon in the recess 101r. More specifically, the lower channel 141 may have an upwardly facing bracket-shaped vertical cross section. Overall, though, it may be seen that the lower channel 141 in examples of the inventive concept has the form of a pot so as to have a bottom wall and a sidewall projecting upwardly from the bottom wall. The sidewall of the lower channel 141 has a top surface in the form of a rim and a sidewall inner surface.

The inner surface delimiting the vertical hole 103 may be of a constituent (e.g., silicon oxide and/or silicon nitride) different from that (e.g., silicon) of the lower channel 141, such that no silicon may be deposited along the vertical hole 103. However, a deposition substance 141a may be undesirably formed along the vertical hole 103. The deposition substance 141a may include amorphous silicon or silicon whose crystallinity is less than that of the lower channel 141.

After the deposition process, an etching process may be performed to remove the deposition substance 141a. The etching process may use an etchant having good etch selectivity between the crystalline lower channel 141 and the amorphous deposition substance 141a. The etchant may include fluorine (F), bromine (Br), iodine (I), or any combination thereof. For example, the etchant may include gaseous $NF_3$, $SF_6$, $Cl_2$, HCl, $CCl_4$, HBr, HI, $ClF_3$, $CF_3Cl$, or the like. When the etching process is performed, a ratio between an etch rate (ER1) of the lower channel 141 and an etch rate (ER2) of the deposition substance 141a may be as follows: ER1:ER2=1:10 or higher.

Figure 2E:
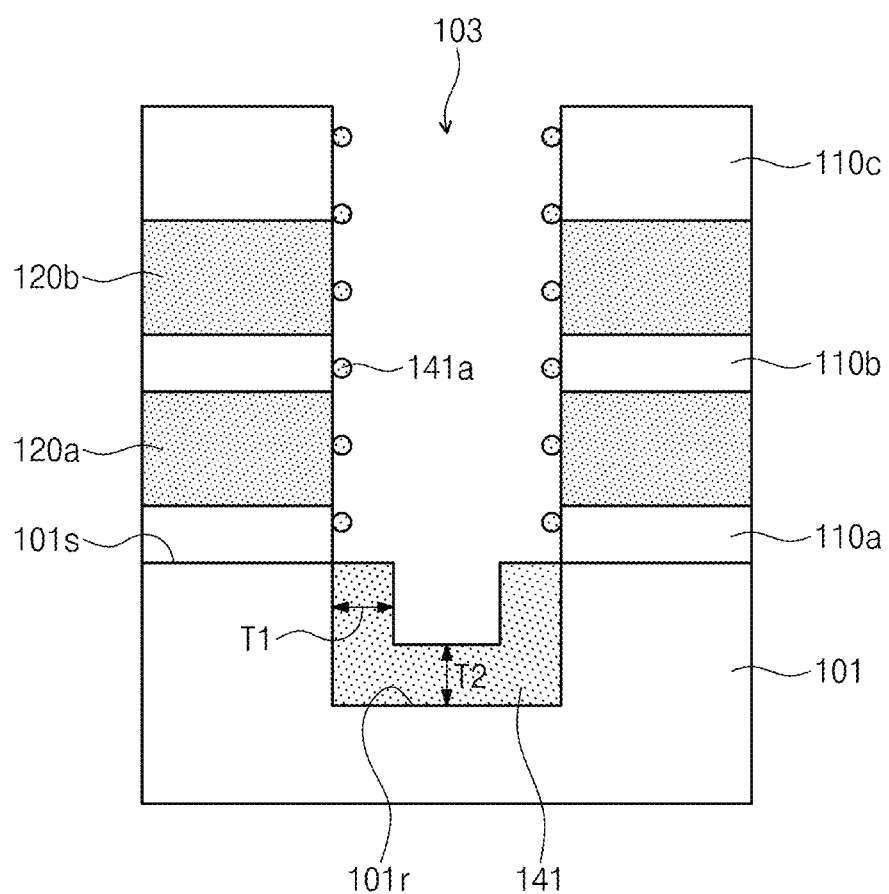

The cyclical process may be performed once to form the lower channel 141. Alternatively or optionally, as illustrated in FIG. 2E, the cyclical process may be repeatedly performed to increase the thickness of the lower channel 141. The lower channel 141 may have a first thickness T1 in a direction parallel to the top surface 101s of the substrate 101 and a second thickness T2 in a direction perpendicular to the top surface 101s of the substrate 101. The first and second thicknesses T1 and T2 may be substantially the same as each other or different from each other. When the cyclical process is terminated, an annealing process may be performed. The annealing process may accelerate crystallization of the lower channel 141 consisting of polycrystalline silicon. The annealing process may crystallize the lower channel 141 consisting of amorphous silicon. The annealing process may be executed between the cyclical processes or between a deposition process and etching process of a cyclical process. Alternatively, no annealing process may be performed. That is, the annealing process may be optional.

When the semiconductor memory device 2 is fabricated, before the mold stack 10 is formed, a peripheral region PR including a peripheral circuit 11 may be formed on a substrate 100 as illustrated in FIGS. 1C and 1D. When the cyclical process is performed, as the deposition process is performed at lower temperature (e.g., about 600° C.), the peripheral circuit 11 may not suffer from thermal damages resulting from high temperature.

Figure 2F:
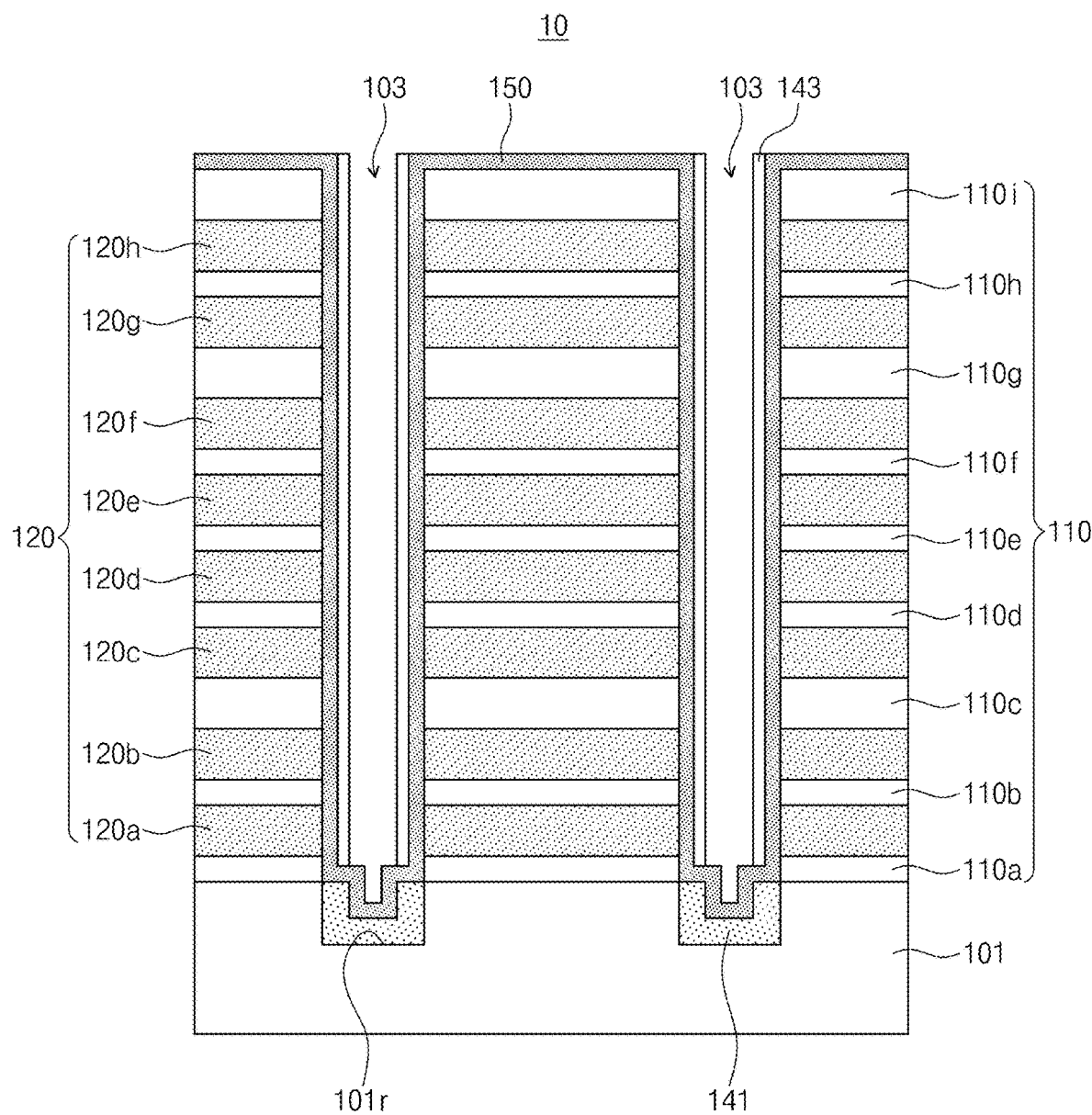
FIGS. 2F, 2H, and 2J are cross-sectional views of the device during the course its manufacture.
Figure 2G:
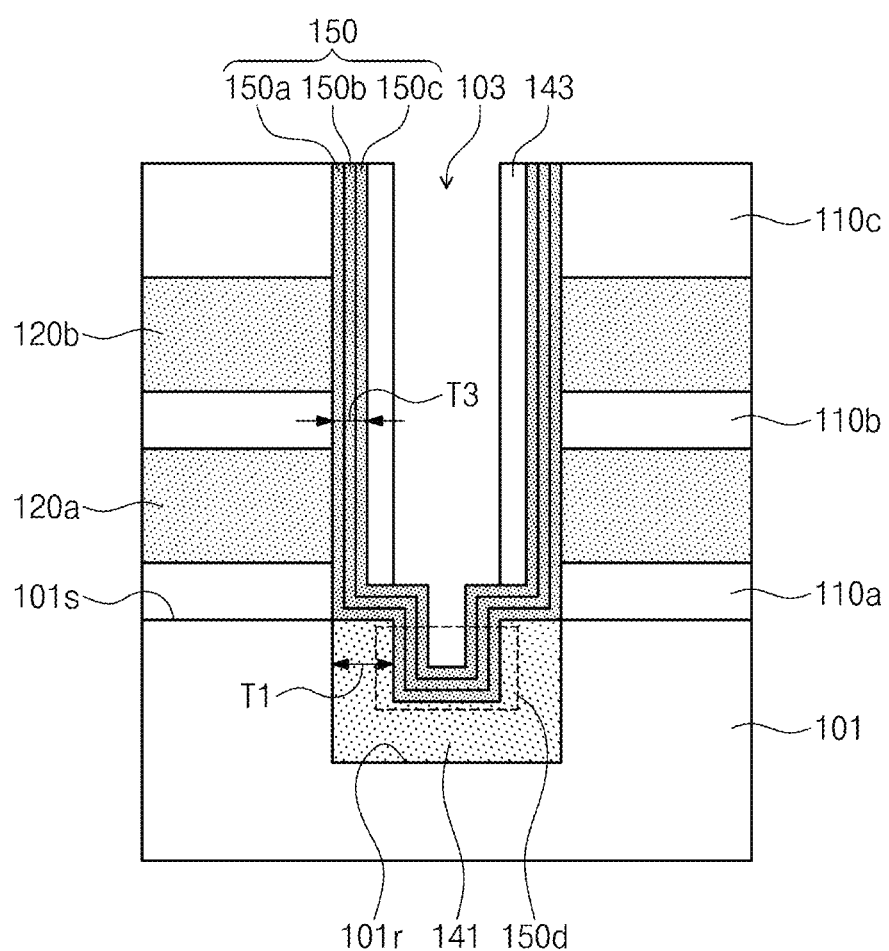
FIGS. 2G, 2I, and 2K are enlargements of portions of the cross-sectional views of FIGS. 2F, 2H, and 2J, respectively, and FIGS.

Referring to FIGS. 2F and 2G, a memory layer 150 may be formed to extend along the vertical hole 103 as disposed in contact with the lower channel 141. Chemical vapor deposition or atomic layer deposition may be employed to deposit a plurality of insulating layers, thereby forming the memory layer 150. Thus, the memory layer 150 may be referred to as a memory layer structure. For example, a blocking insulating layer 150a, a trap insulating layer 150b, and a tunnel insulating layer 150c may be sequentially deposited to form the memory layer 150. The blocking insulating layer 150a may include $SiO_2$ or $SiO_2/Al_2O_3$. The trap insulating layer 150b may include SiN or SiON. The tunnel insulating layer 150c may include $SiO_2$. As anther example, the memory layer 150 includes a transition metal oxide layer.

The memory layer 150 may have a thickness T3 identical to or less than the first thickness T1 of the lower channel 141. The memory layer 150 may extend perpendicularly to the top surface 101s of the substrate 101 and protrude into the recess 101r. The memory layer 150 may have a bottom end 150d that extends into the recess 101r and is surrounded by the lower channel 141. Alternatively or optionally, a buffer layer 143 may be formed to have a spacer shape extending along the memory layer 150. The buffer layer 143 may include an insulating layer such as an oxide layer or a nitride layer.

Figure 2H:
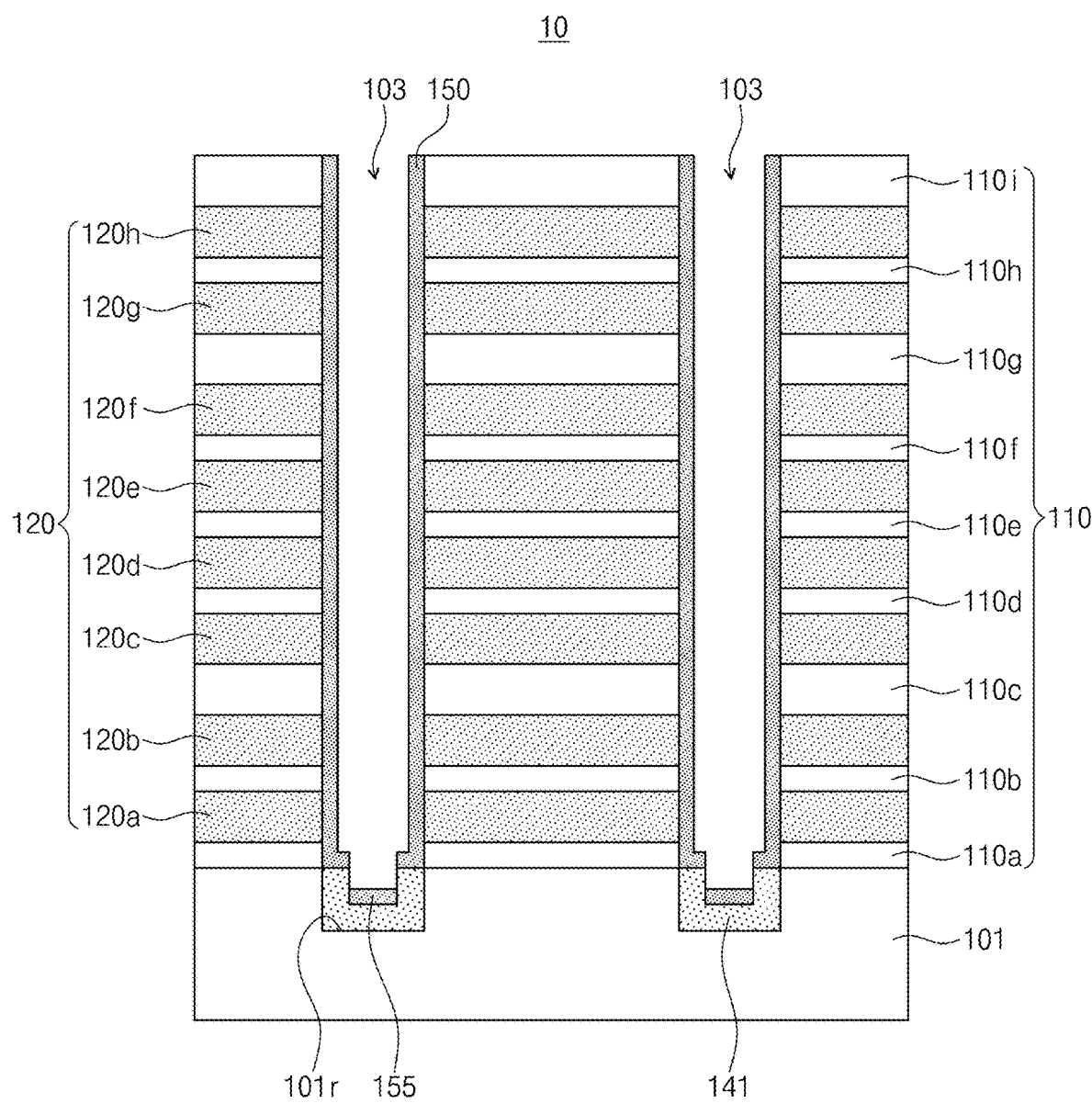
Figure 2I:
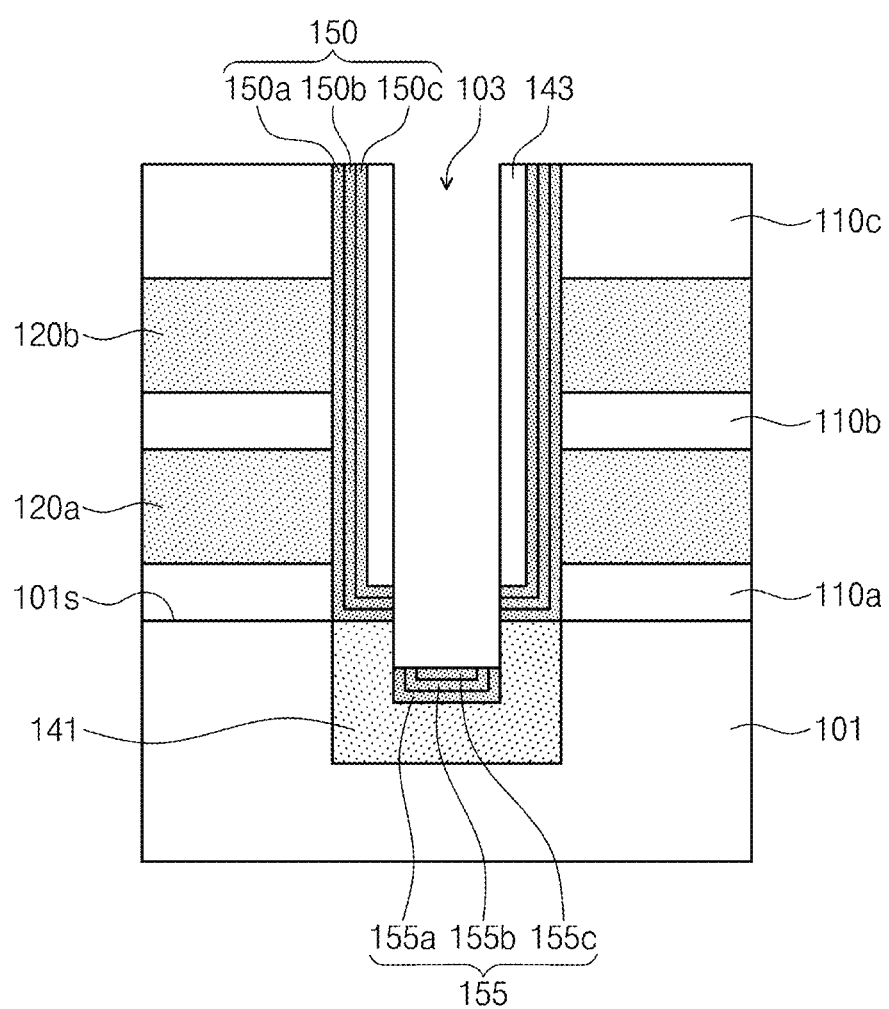

Referring to FIGS. 2H and 2I, the memory layer 150 may be patterned using an etching process in which the buffer layer 143 serves as an etch mask. The buffer layer 143 may be removed or remain after the patterning process. As a result of the patterning process, part of an inner sidewall of the lower channel may be exposed to the vertical hole 103. The patterning process may also cause the memory layer 150 to extend in a direction perpendicular to the top surface 101s of the substrate 101 and to have an "L" shape on the lower channel 141.

Note, the shapes of elements may be described herein with reference to their cross sections or profiles as viewed in section (the latter applying to the description of memory layer 150 as having an "L" shape. In more detail, each half of the memory layer 150 on opposite sides of a vertical plane passing through an axial center of the memory layer 150 has an L-shaped vertical cross section. A leg of the "L" shape, constituting the bottommost portion of the memory layer 150, extends horizontally parallel to the top surface of the substrate 101. Overall, though, it can be seen that the memory layer 150 may have the shape of a cylinder with a bottom end closed except for an opening therethrough at the axial center of the memory layer 150.

The bottom end 150d of the memory layer 150 as illustrated in FIG. 2G may be partially etched by the patterning process, and may thus convert into a residual layer 155 surrounded by the lower channel 141 in the recess 101r. The residual layer 155 may include a residual blocking insulating layer 155a, a residual trap insulating layer 155b, and a residual tunnel insulating layer 155c that are sequentially stacked.

Figure 2J:
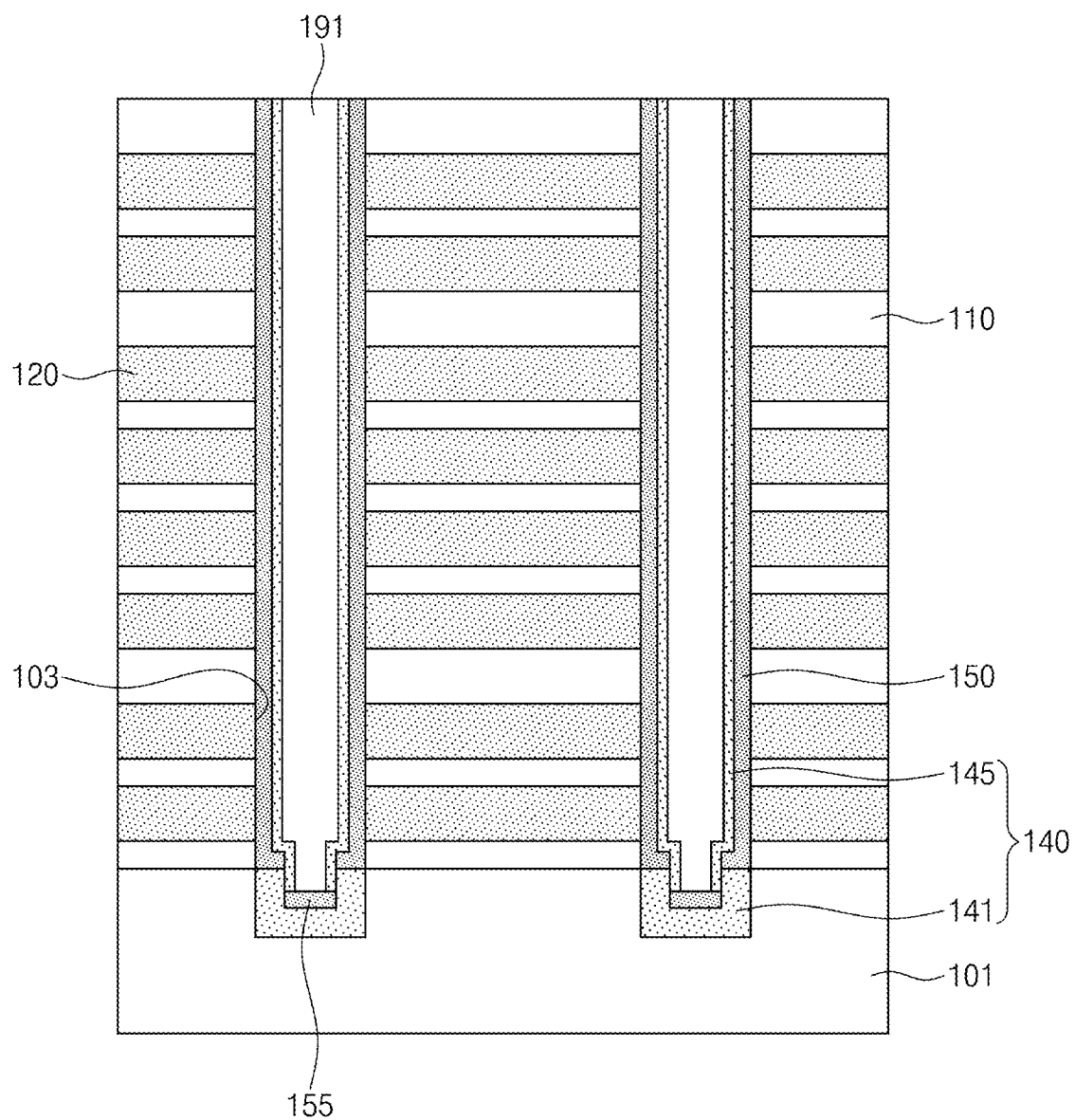
Figure 2K:
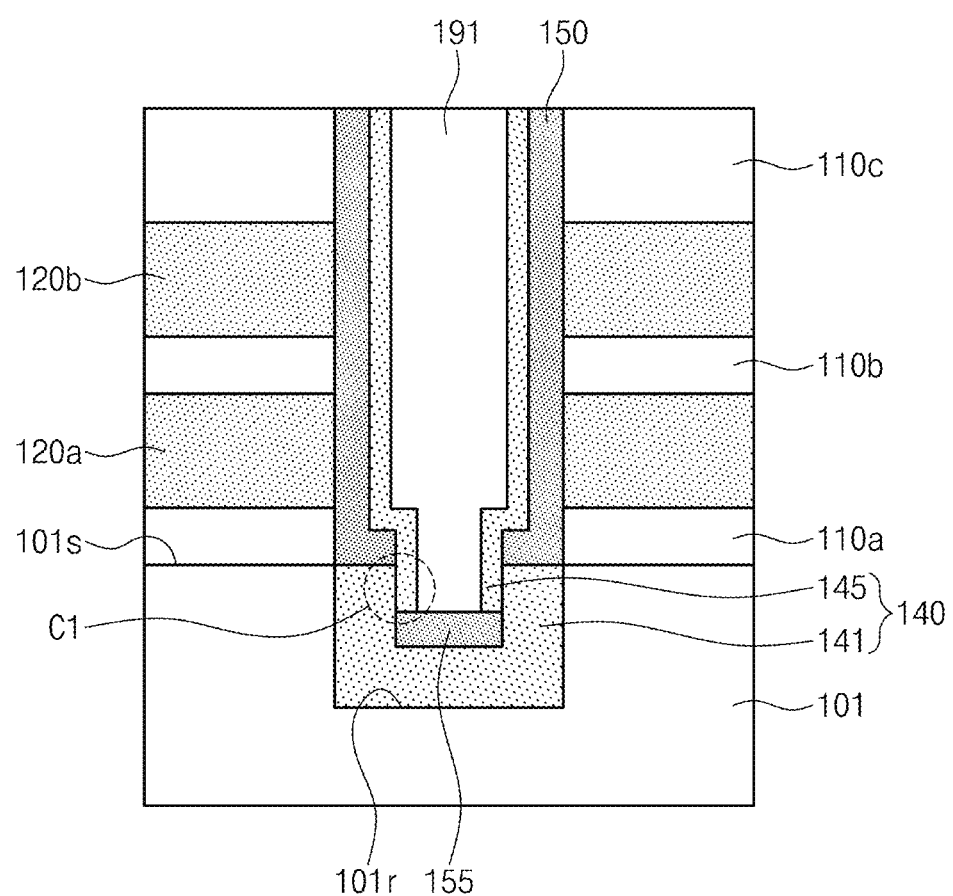

Referring to FIGS. 2J and 2K, an upper channel 145 (which may be referred to as an upper portion of the vertical channel) may be formed to extend conformally along the memory layer 150 in the vertical hole 103, and a gap-fill layer 191 may be formed to fill the vertical hole 103. Chemical vapor deposition may be employed to deposit amorphous or polycrystalline silicon, thereby forming the upper channel 145. An annealing process may further be performed to convert the amorphous silicon into crystalline silicon. The gap-fill layer 191 may be formed by depositing a silicon oxide layer or a silicon nitride layer.

Through depositing silicon and patterning the silicon, the upper channel 145 may have a crook alongside (the bottommost portion of) the memory layer 150 having the "L" shape. The upper channel 145 may have a bottom end in contact with the residual layer 155. The upper channel 145 may be connected to the lower channel 141 to constitute a substantially tubular vertical channel 140. Alternatively, the vertical hole 103 may be completely filled with the upper channel 145 to form a pillar-shaped vertical channel 140 The vertical channel 140 may have a lateral connection structure C1. In this respect, the lower and upper channels 141 and 145 constitute the connection structure C1. The connection structure C1 has an interface along which the lower channel 141 and the upper channel 145 meet and through which a conductive path between the lower channel and the upper channel is established. In this example and in some examples that follow, the interface is situated no higher than the top surface of the substrate. For example, the bottom end of the upper channel 145 may be in contact with a portion of the exposed inner sidewall (surface) of the lower channel 141, which may form the lateral connection structure C1.

Figure 2L:
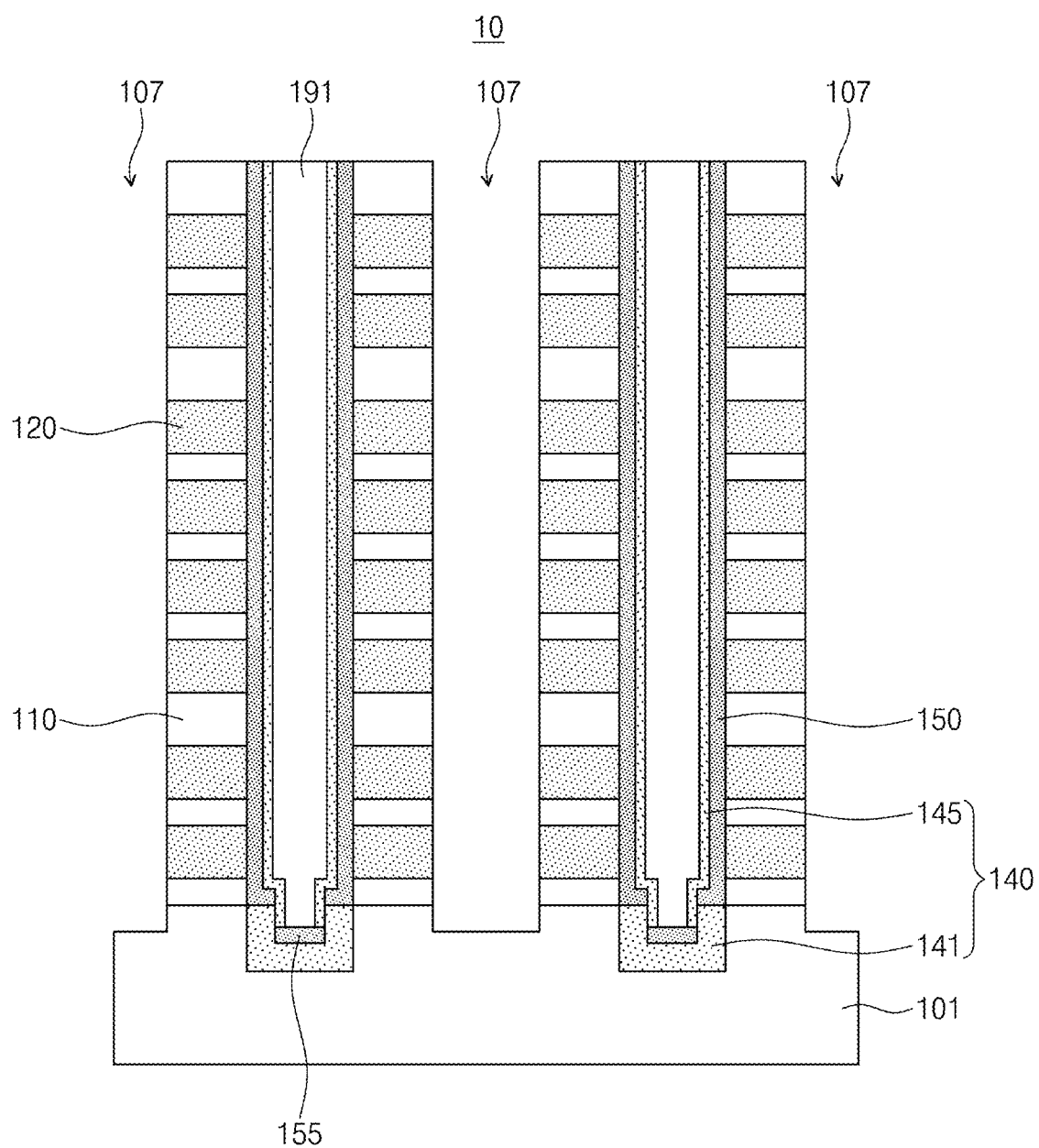

Referring to FIG. 2L, a word line cut 107 may be formed to expose the substrate 101 between vertical channels 140. For example, the mold stack 10 may be dry-etched to form the word line cut 107 penetrating the mold stack 10. The substrate 101 may be recessed by an over-etching. The word line cut 107 may expose sidewalls of the sacrificial layers 120 and sidewalls of the insulating layers 110.

Figure 2M:
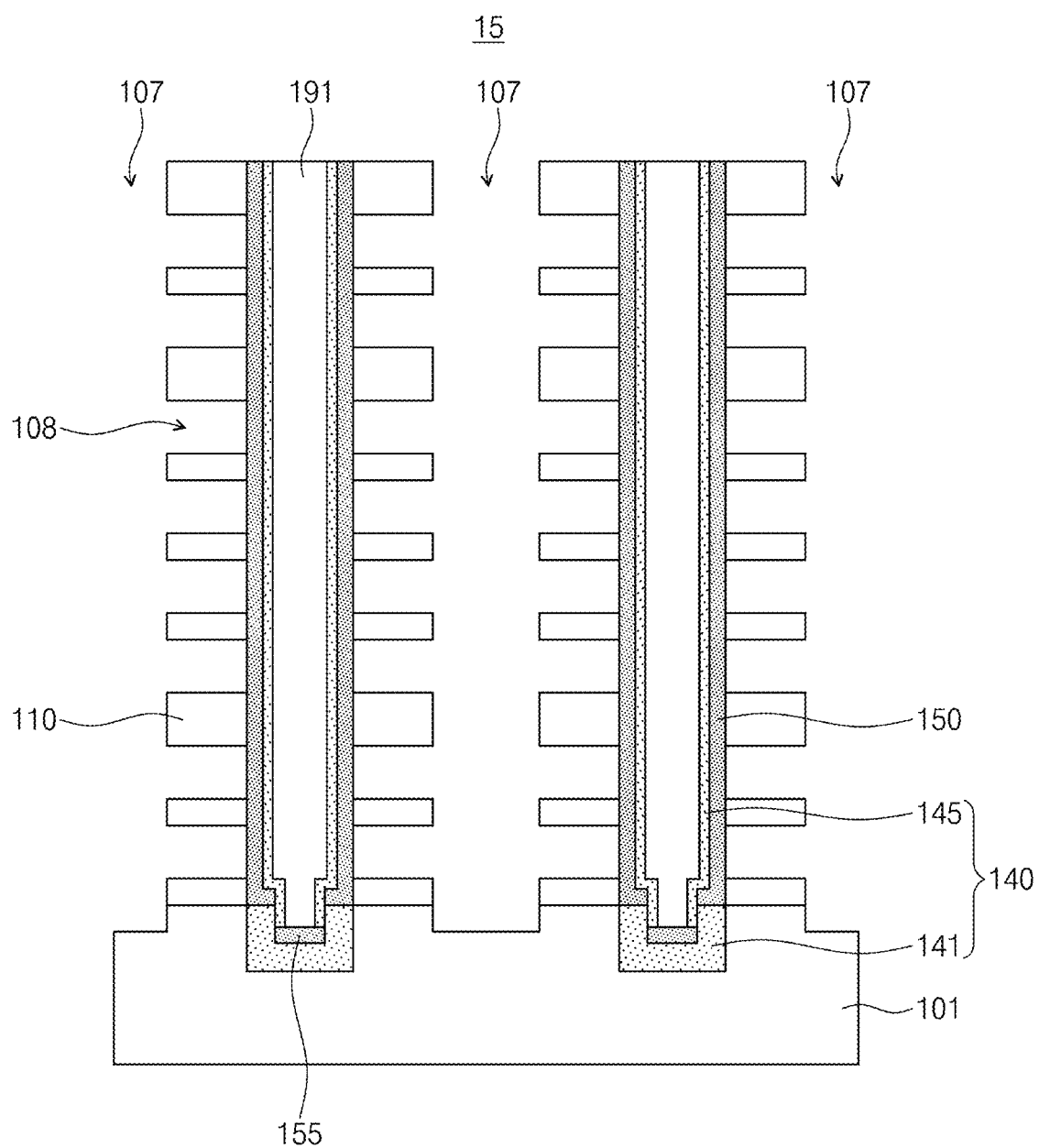

Referring to FIG. 2M, an etchant may be provided through the word line cut 107 to selectively remove the sacrificial layers 120. The selective removal of the sacrificial layers 120 may form a mold wing 15 in which the insulating layers 110 are vertically spaced apart from each other along the vertical channel 140. For example, when the sacrificial layers 120 are silicon nitride layers and the insulating layers 110 are silicon oxide layers, the etchant may include phosphoric acid ($H_3PO_4$). The selective removal of the sacrificial layers 120 may form spaces 108 between the insulating layers 110.

Figure 2N:
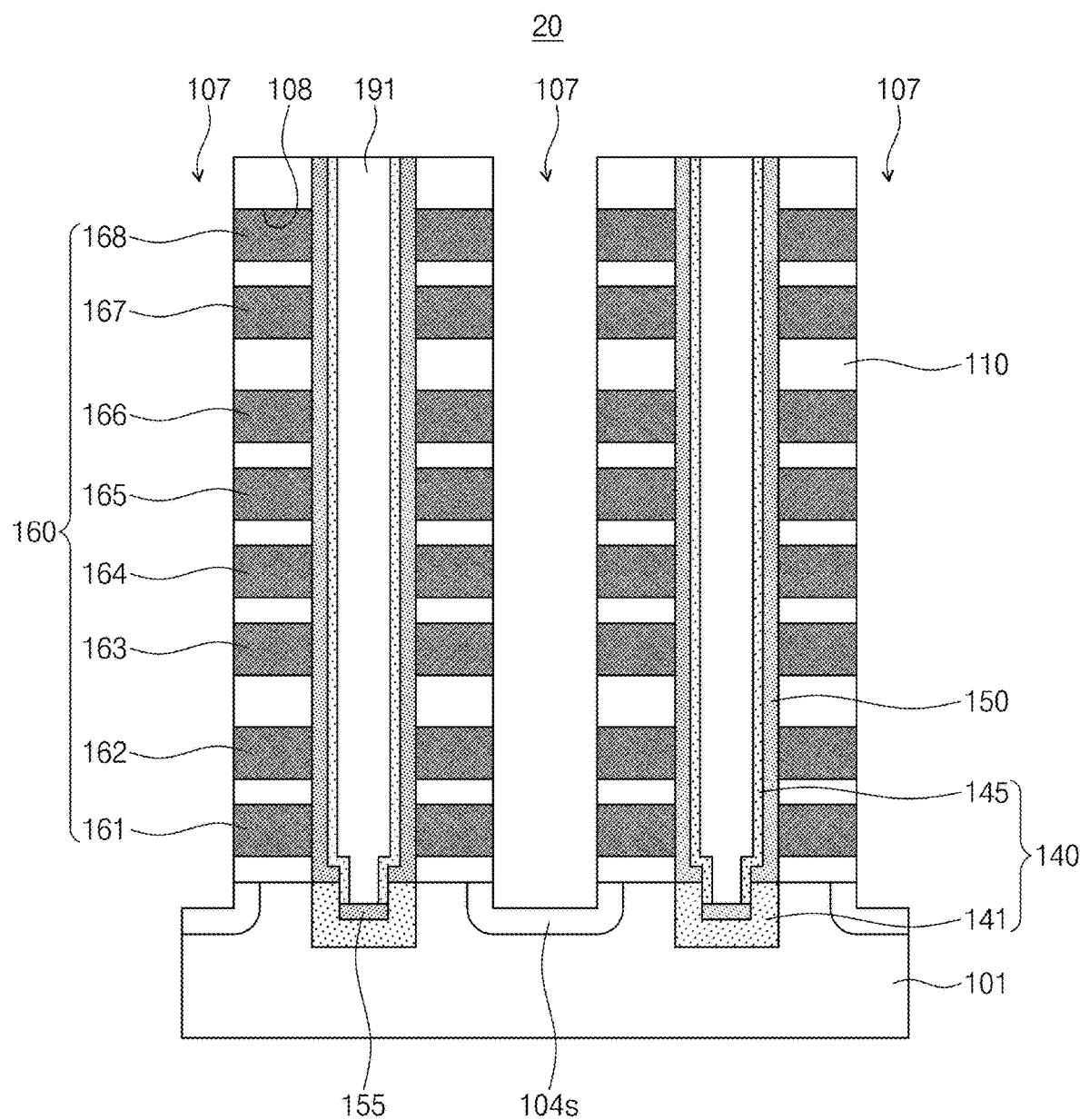

Referring to FIG. 2N, the spaces 108 may be filled with gates 160 including first to eighth gates 161 to 168. Therefore, a gate stack 20 may be formed to include the first to eighth gates 161 to 168 vertically stacked and spaced apart from each other across the insulating layers 110. A conductive material such as silicon, metal, metal nitride, and/or metal silicide may be deposited on the substrate 101, and then the deposited conductive material may be patterned to form the gates 160. Before the gate stack 20 is formed, the mold stack 10 of FIG. 2J may be patterned to form a stepwise structure. Accordingly, the gates 160 may have the stepwise structure 111 as illustrated in FIGS. 1A and 1B.

Impurities may be implanted into the substrate 101 exposed to the word line cut 107 to form a common source 104s. The common source 104s may contain impurities whose conductivity is different from that of the substrate 101. For example, when the substrate 101 is doped with p-type impurities, the common source 104s may contain n-type impurities.

Figure 2O:
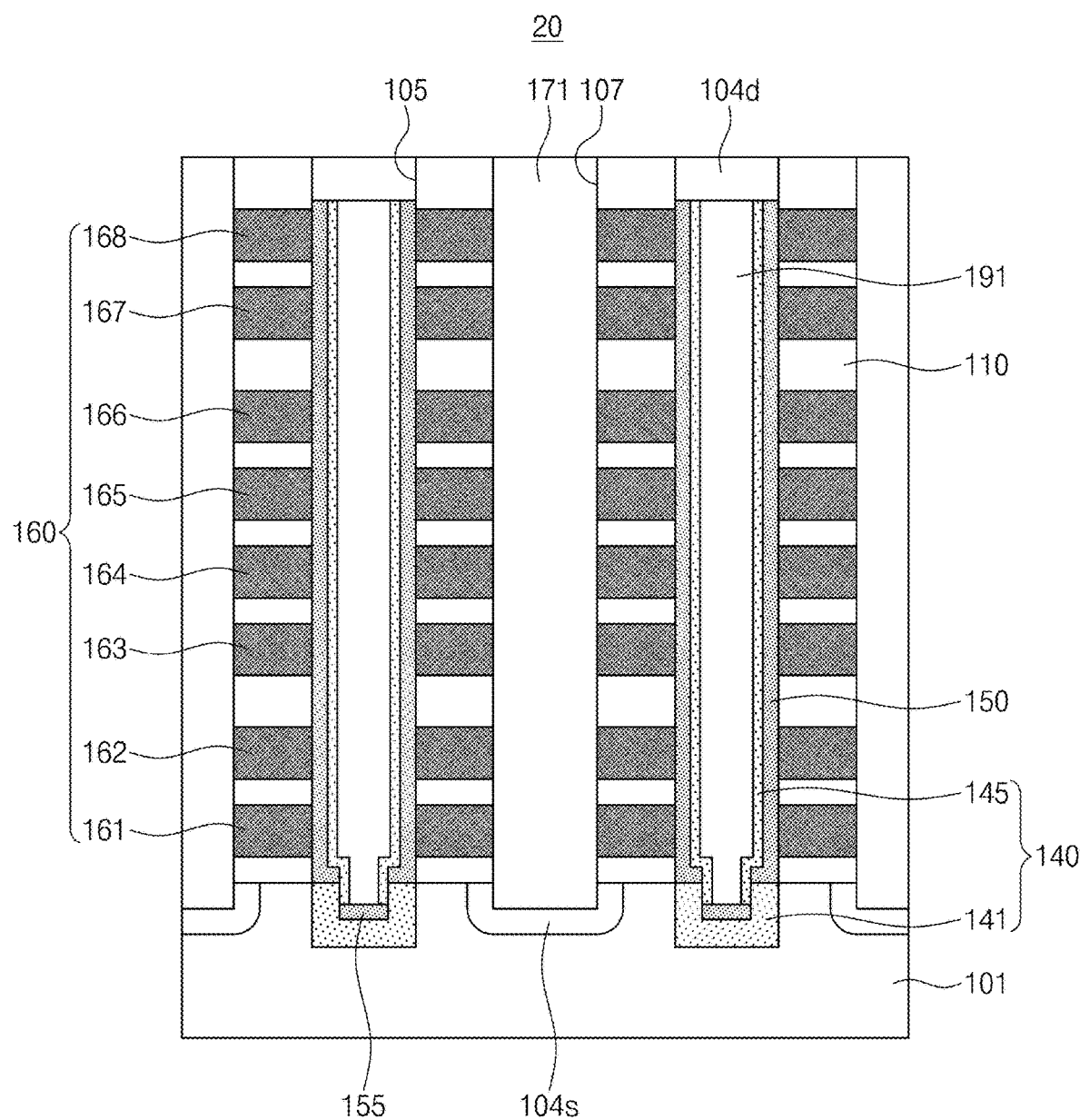

Referring to FIG. 2O, a filling insulating layer 171 may be formed to fill the word line cut 107. For example, an insulating material may be deposited to cover the gate stack 20, and then the deposited insulating material may be planarized to form the filling insulating layer 171. A top end of the vertical channel 140 may be removed to form an opening 105, and the opening 105 may be filled with silicon and then impurities may be implanted to form a drain 104d having the same conductivity as that of the common source 104s.

Figure 2P:
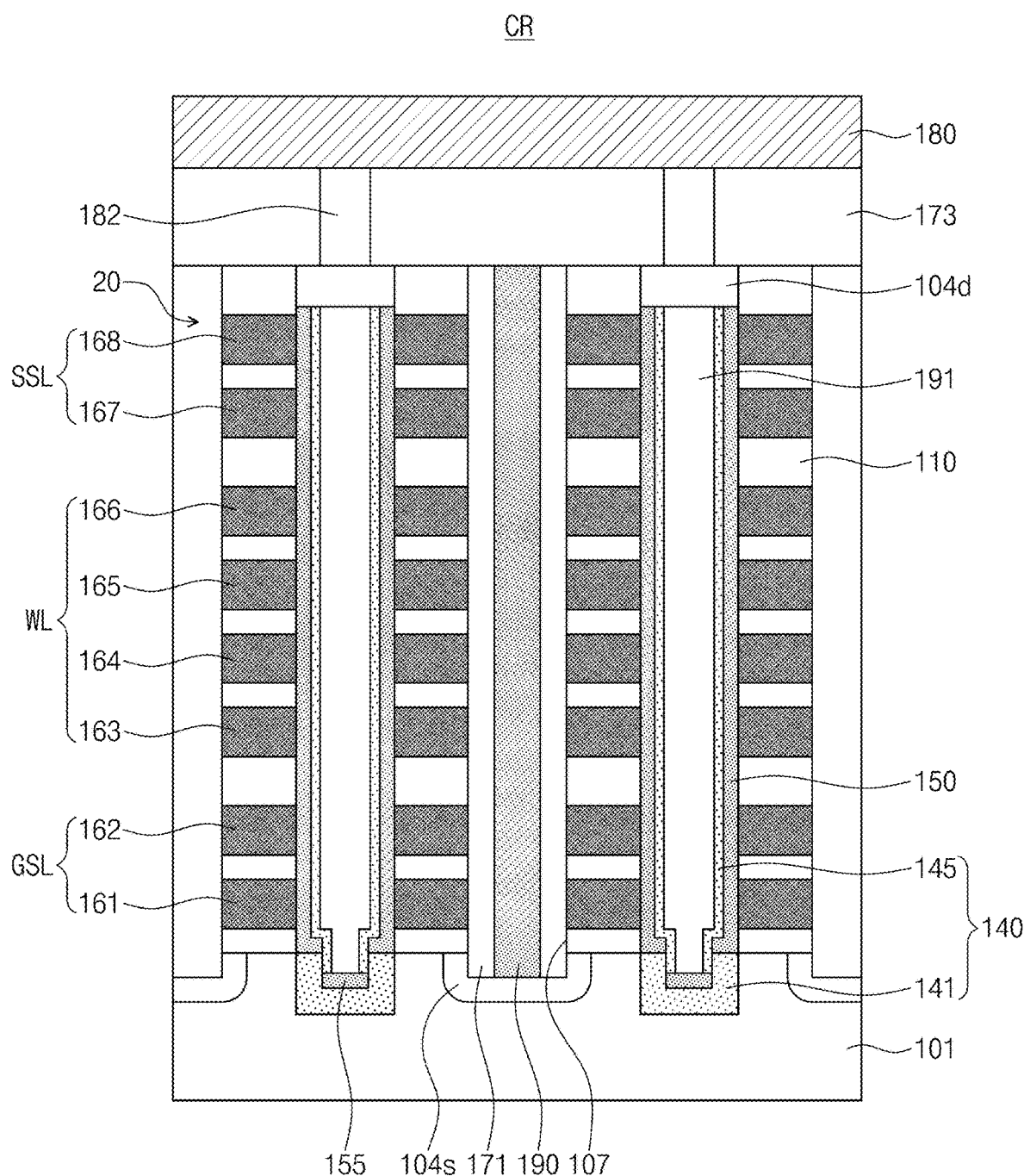

Referring to FIG. 2P, an interlayer dielectric layer 173 may be formed to cover the gate stack 20, and a plug 182 may be formed to penetrate the interlayer dielectric layer 173 to connect with the drain 104d. A bit line 180 may be formed on the interlayer dielectric layer 173 so as to be electrically connected to the vertical channel 140 through the plug 182 coupled to the bit line 180. A common source plug 190 may be formed to penetrate the filling insulating layer 171 so as to be electrically connected to the common source 104s. A cell region CR may be formed through the processes mentioned above. The peripheral region PR of FIG. 1B may be formed simultaneously with the cell region CR.

The first to eighth gates 161 to 168 may extend on the substrate 101 in a first horizontal direction (e.g., a front and rear direction), and the bit line 180 may extend on the substrate 101 in a second horizontal direction (e.g., a left and right direction) substantially perpendicular to the first horizontal direction. A cell string may be formed or constituted by the first to eighth gates 161 to 168 vertically stacked along the vertical channel 140.

The first and second gates 161 and 162 may be non-memory select gates to constitute a double-layered ground select line GSL. The third to sixth gates 163 to 166 may be memory gates to constitute word lines WL. The seventh and eighth gates 167 and 168 may be non-memory select gates to constitute a double-layered string select line SSL.

Figure 3A:
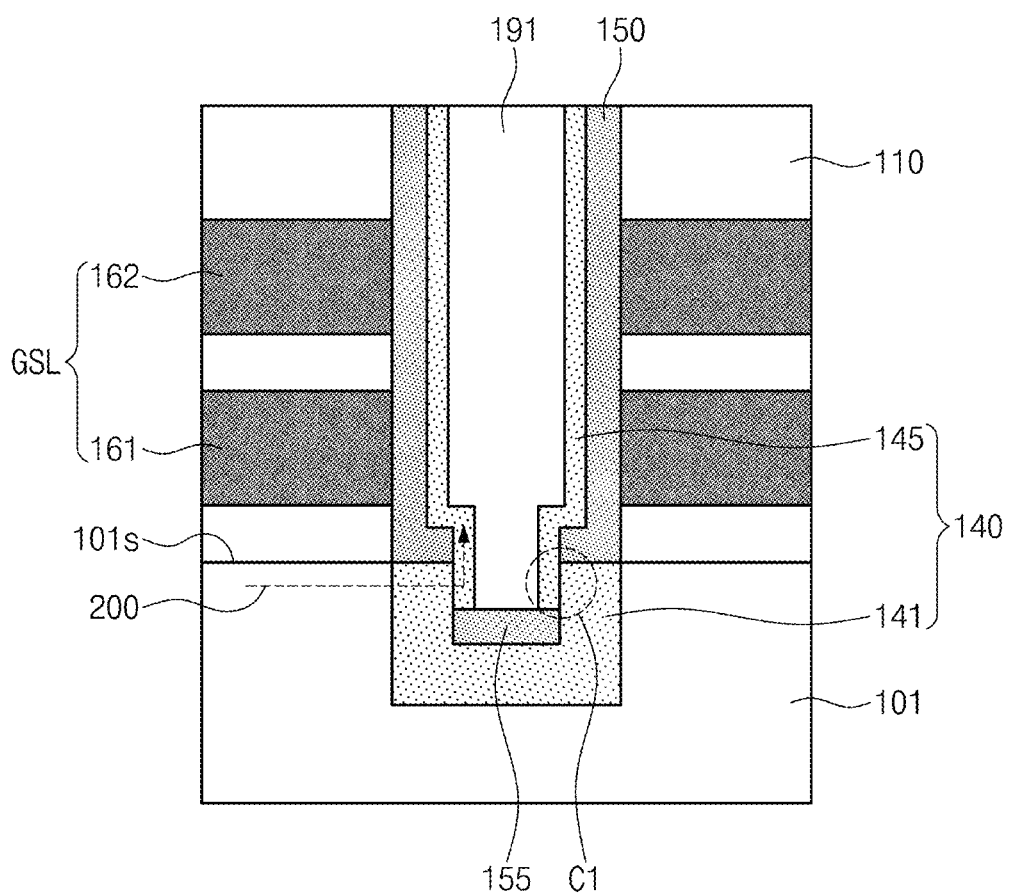
FIGS. 3A, 3B, 3C, 3D and 3E are enlarged cross-sectional views of different versions of a portion of the device shown in FIG. 2P, according to the present inventive concept.

The cell region CR may, as illustrated in FIG. 3A, have a minimized current path 200. To this end, the lateral connection structure C1 may provide a sufficient area for current flow between the lower channel 141 and the upper channel 145. The memory layer 150 may not protrude below the top surface 101s of the substrate 101 and the lower and upper channels 141 and 145 may be mutually connected through the lateral connection structure C1 formed below the top surface 101s of the substrate 101. In this example, an upper end of the interface of the connection structure C1 is located in a plane that coincides with the top surface 101s of the substrate 101. As such, there may be no obstacle to increase the current path 200, such that good current flow may be allowed through the lateral connection structure C1. As a result, the cell region CR may have improved electrical characteristics.

Figure 3B:
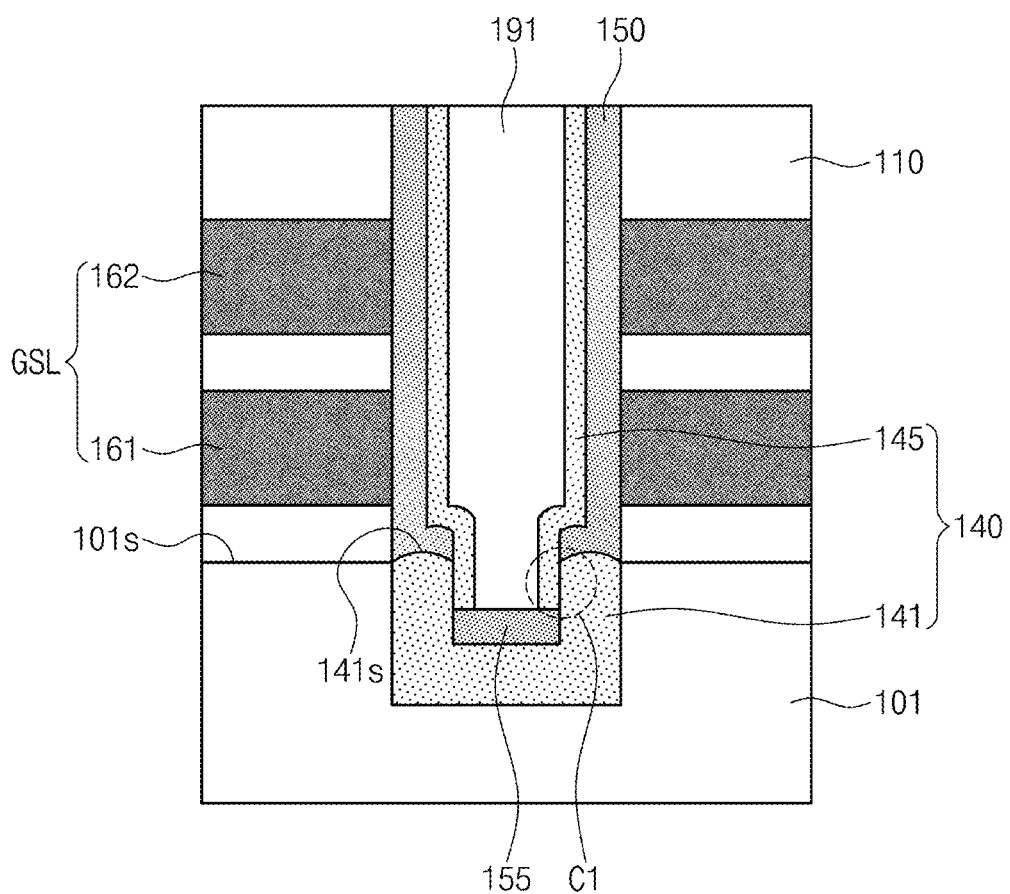

The lower channel 141 may, as illustrated in FIG. 3B, have a convex top surface 141s protruding over the top surface 101s of the substrate 101. For example, a deposition direction of silicon may be primarily directed into the recess 101r in the deposition process discussed above with reference to FIGS. 2D and 2E.

Nevertheless, the silicon may also be deposited in a direction toward the top surface 101s of the substrate 101. Therefore, the lower channel 141 may have the convex top surface 141s. Alternatively, the lower channel 141 may have a flat top surface 141s. The flat top surface 141s of the lower channel 141 may be coplanar with the top surface 101s of the substrate 101. In either of these examples as well, an upper end of the interface of the connection structure C1 may be located in a plane that coincides with the top surface 101s of the substrate 101.

Figure 3C:
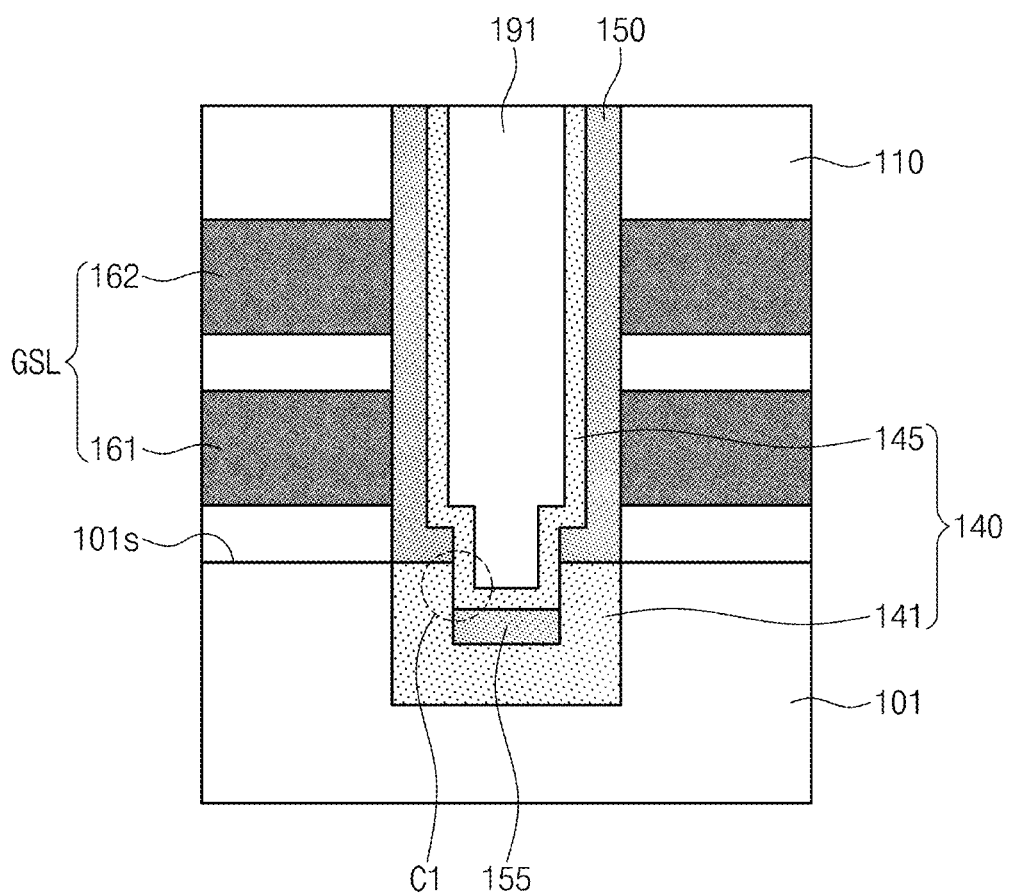

The upper channel 145 may, as illustrated in FIG. 3C, have a cylindrical shape whose top end is opened and whose bottom end is closed. For example, no patterning process may be performed in the deposition and patterning processes discussed above with reference to FIGS. 2J and 2K. Thus, the bottom end of the upper channel 145 may be contiguous with the remainder of the upper channel. Still, in this example as well, an upper end of the interface of the connection structure C1 is located in a plane that coincides with the top surface 101s of the substrate 101.

Figure 3D:
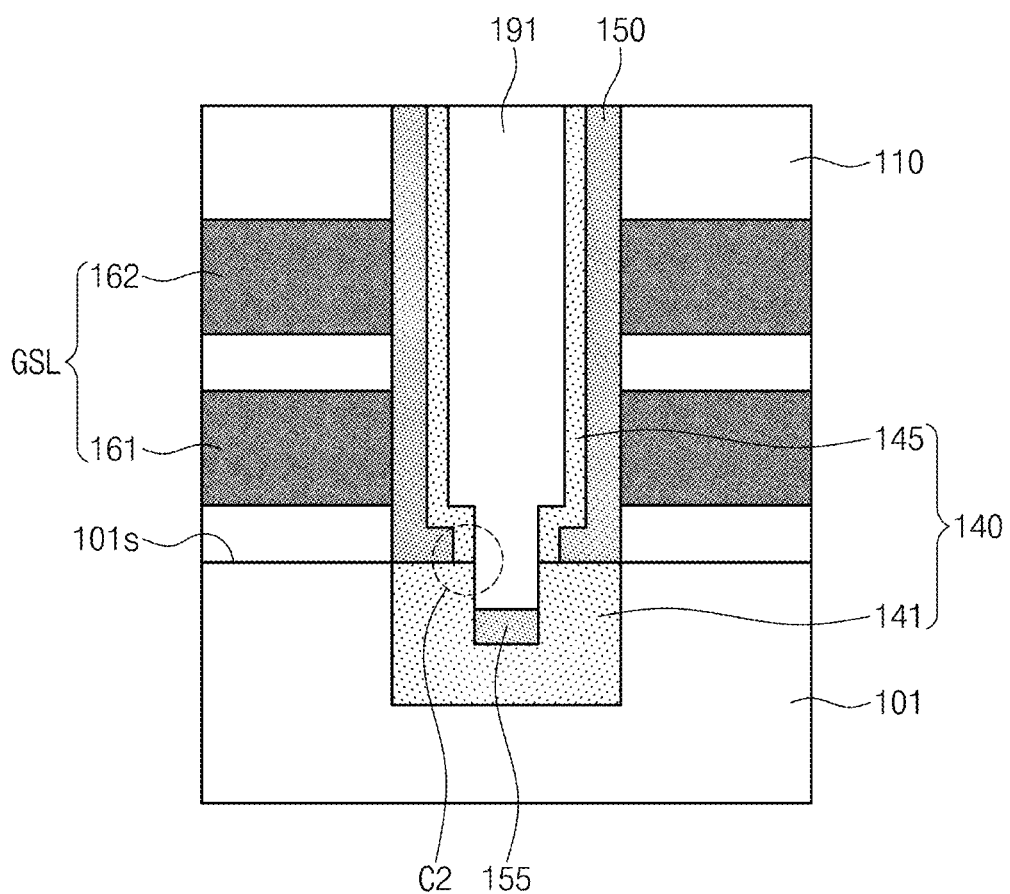

Various connections may be created between the upper and lower channels 145 and 141, i.e., the connection structure may be different from the lateral connection structure C1. For example, as illustrated in FIG. 3D, the upper channel 145 may be in contact with a portion of a top surface of the lower channel 141 to form an upward connection structure C2. The upward connection structure C2 may have an interface (discernible) boundary between the upper channel 145 and the lower channel 141 at the same level as that of the top surface 101s of the substrate 101. In this example, inner and outer ends of the interface and moreover, the entirety of the interface of the connection structure C2 is located in a plane that coincides with the top surface 101s of the substrate 101.

Figure 3E:
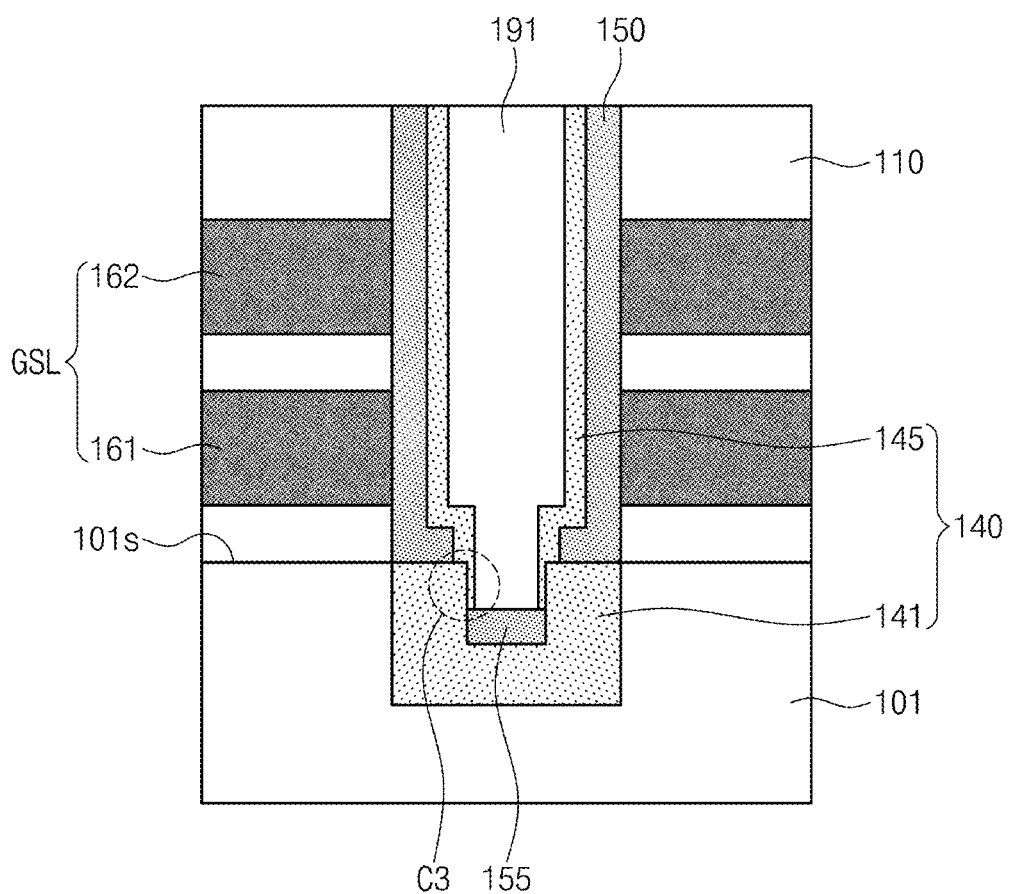

As another example, as illustrated in FIG. 3E, the upper channel 145 may be in contact with a portion of the sidewall inner surface and a portion of the top surface of the lower channel 141 to form a complex connection structure C3. In this example, a radially outer end of the interface of the connection structure C3 and moreover, the entirety of an uppermost part of the interface, is located in a plane that coincides with the top surface 101s of the substrate 101.

Other examples of a method of fabricating a semiconductor memory device according to the present inventive concept will now be described in detail with reference to FIGS. 4A to 4E.

Figure 4A:
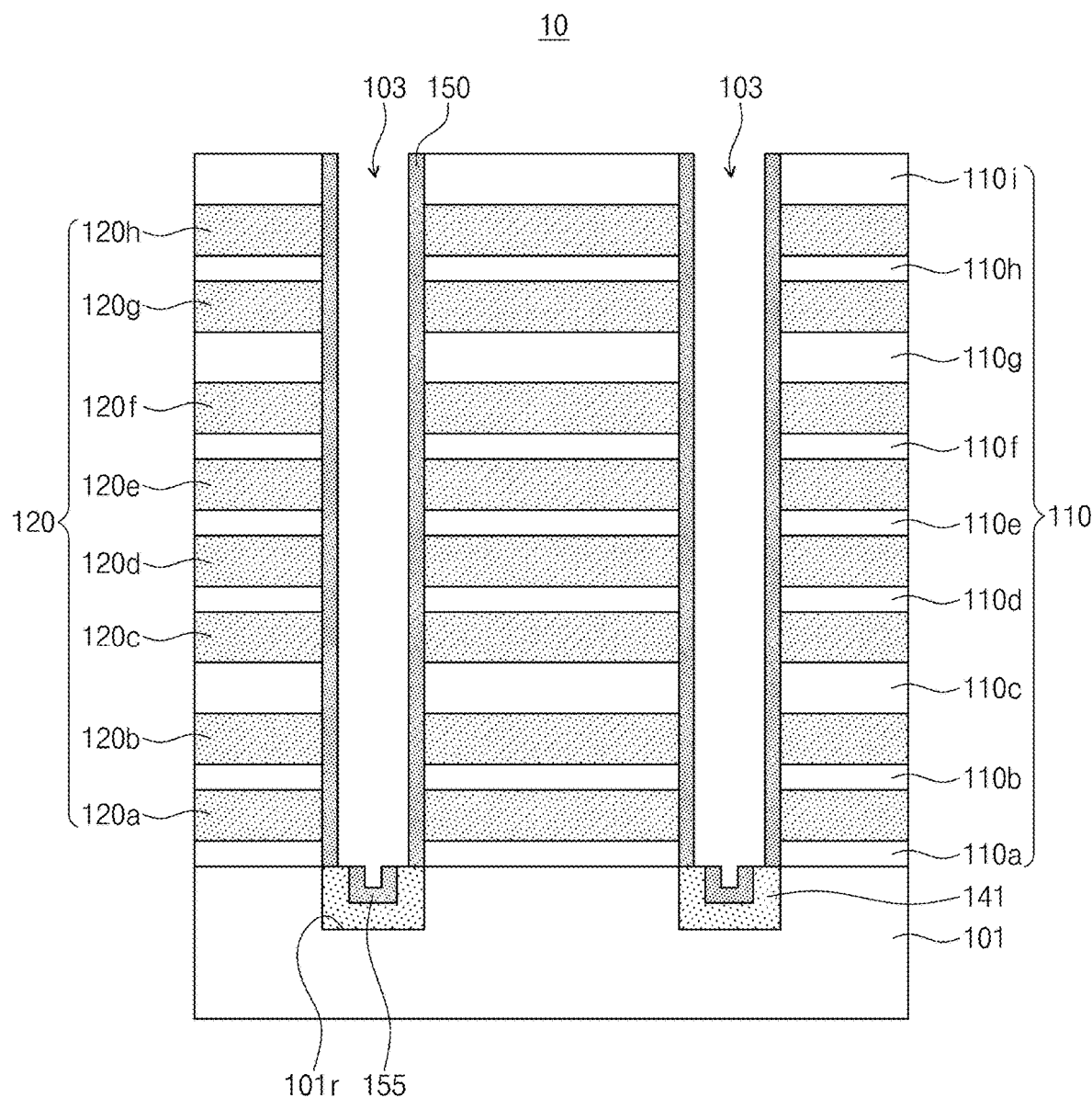
Figure 4B:
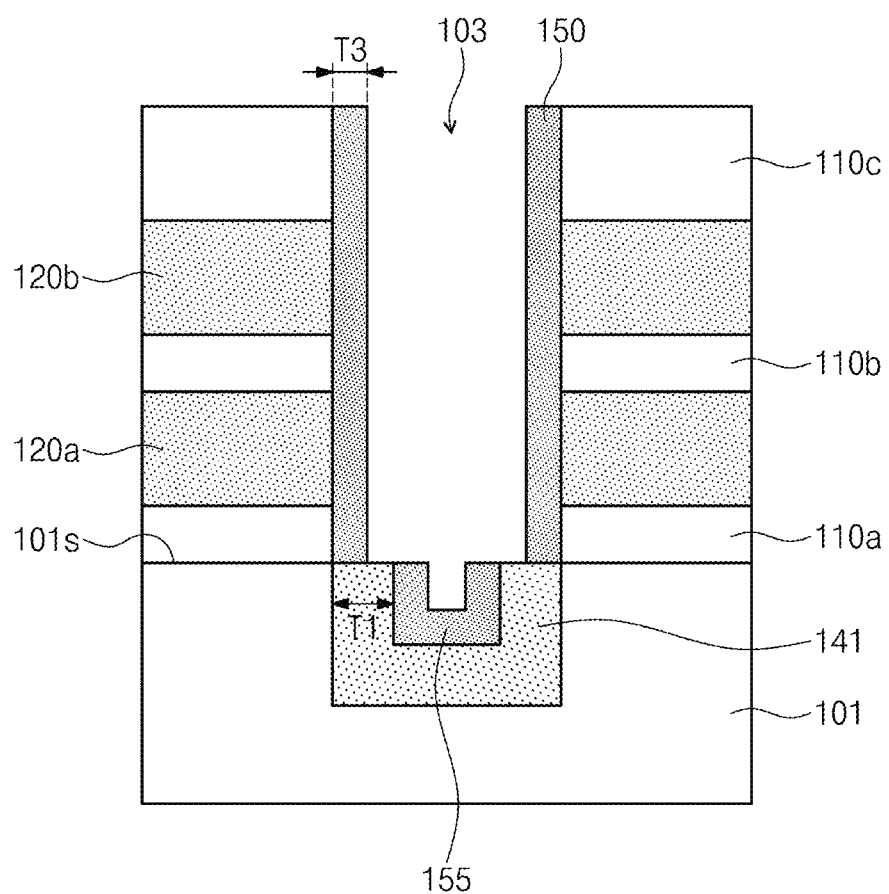

Referring to FIGS. 4A and 4B, processes substantially the same as those described above with reference to FIGS. 2A to 2G are preformed to form structure in which memory layer 150 extends along the vertical hole 103 and is contact with the lower channel 141. The memory layer 150 may extend generally perpendicular to the top surface 101s of the substrate 101. The bottom end of the memory layer 150 may have a vertical shape instead of an "L" shape. The residual layer 155 may have a bracket shape conforming to the shape of the lower channel 141. The thickness T3 of the memory layer 150 may be less than the first thickness T1 of the lower channel 141. Therefore, the lower channel 141 may have a top surface partially exposed by the vertical hole 103.

Figure 4C:
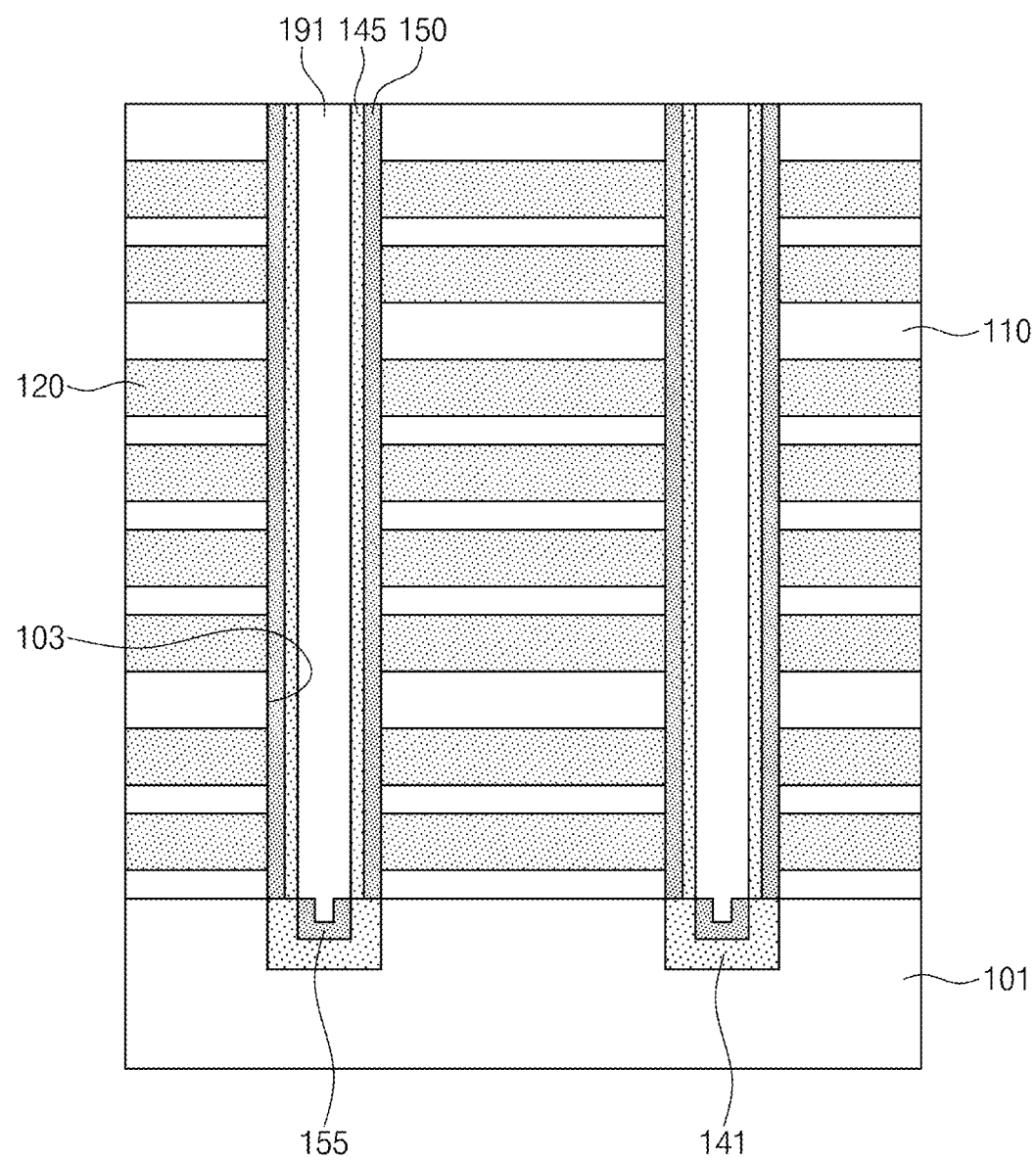
Figure 4D:
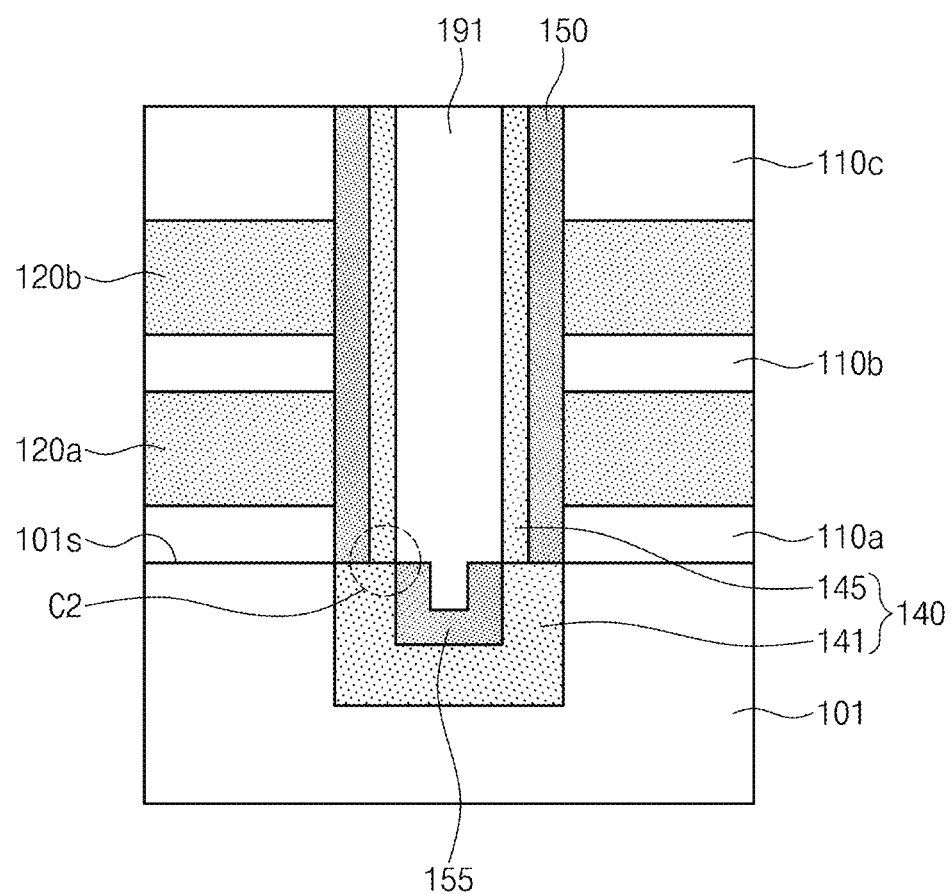

Referring to FIGS. 4C and 4D, the upper channel 145 may be formed to extend along the memory layer 150 in the vertical hole 103, and the gap-fill layer 191 may be formed to fill the vertical hole 103. The upper channel 145 may have a cylindrical shape whose top and bottom ends are open. The bottom end of the upper channel 145 may be in contact with the exposed top surface of the lower channel 141. The upper and lower channels 145 and 141 may be connected to each other to constitute the vertical channel 140. The vertical channel 140 may have the upward connection structure C2. For example, the upper channel 145 may be connected to the exposed top surface of the lower channel 141 to constitute the upward connection structure C2.

Figure 4E:
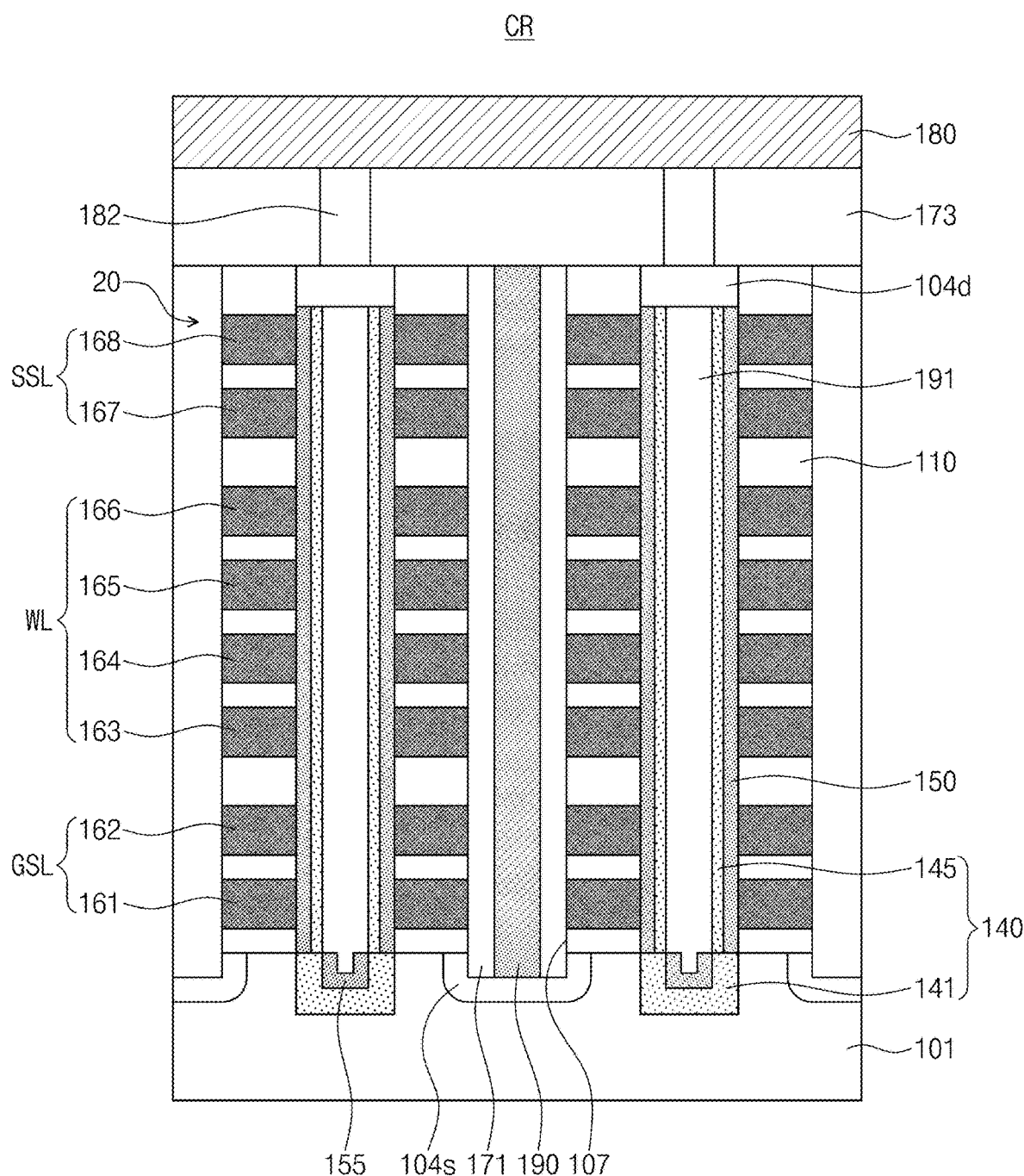
Figure 5A:
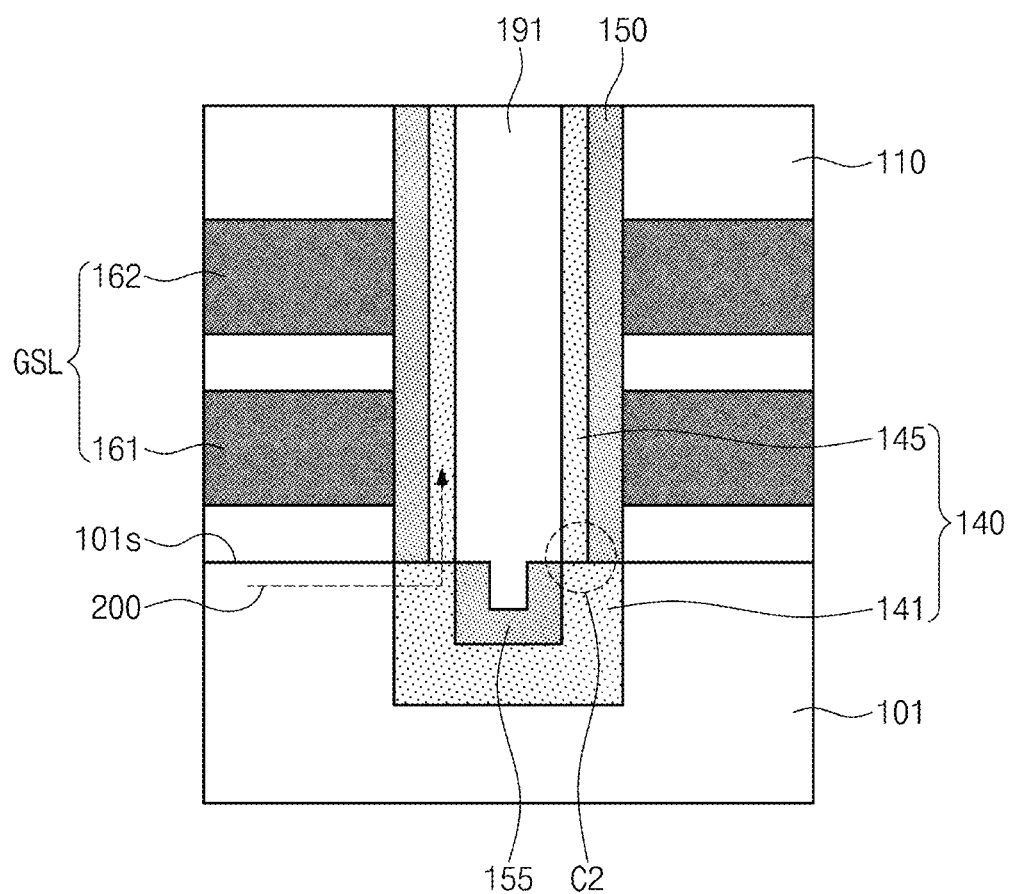
FIGS. 5A, 5B and 5C are enlarged cross-sectional views of different versions of a portion of the device shown in FIG. 4E.

Referring to FIG. 4E, processes substantially the same as those discussed above with reference to FIGS. 2I to 2P may be performed to form the cell region CR. The cell region CR may, as illustrated in FIG. 5A, provide the minimized current path 200 and the upward connection structure C2 that provides a sufficient area for the current flow. The upward connection structure C2 may have an interface or boundary formed at the same level as that of the top surface 101s of the substrate 101.

Figure 5B:
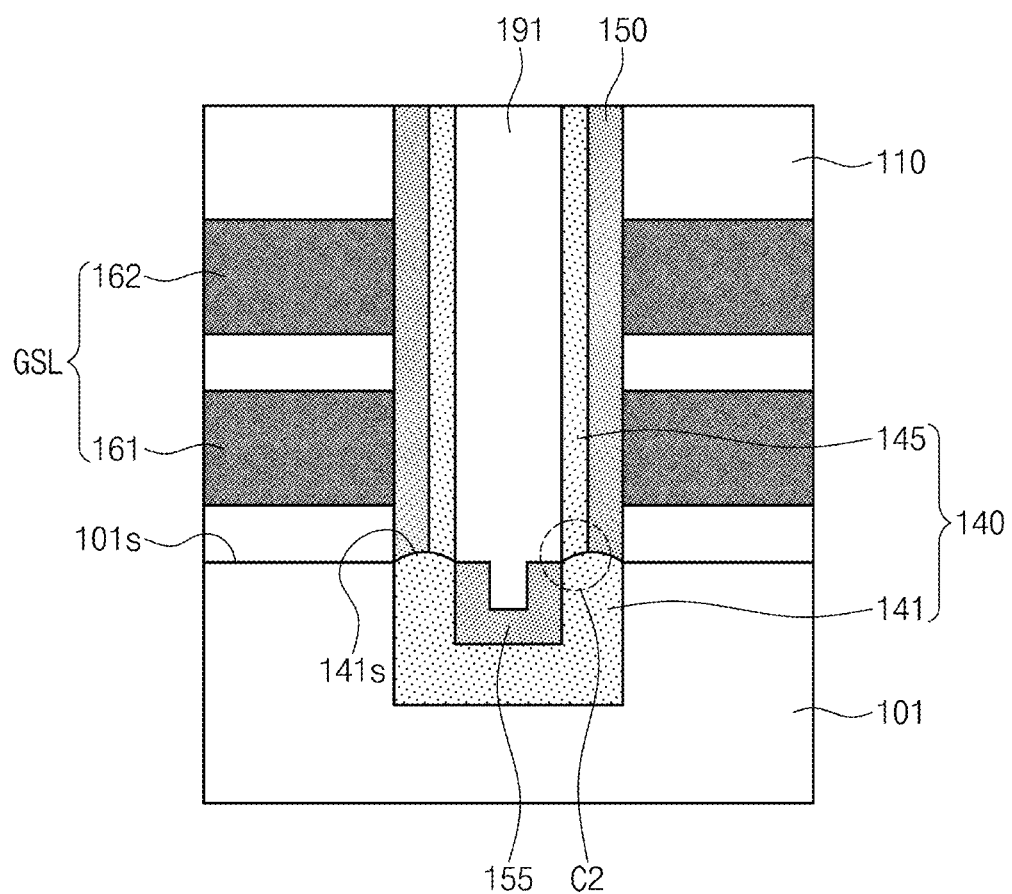

The lower channel 141 may, as illustrated in FIG. 5B, have the convex surface 141s protruding over the top surface 101s of the substrate 101. In this example, the interface of the connection structure is located substantially at the level of the top surface 101s of the substrate 101. More specifically, a radially inner end of the interface of the connection structure C2 may be located adjacent the residual layer 155 in a plane that coincides with the top surface 101s of the substrate 101.

Figure 5C:
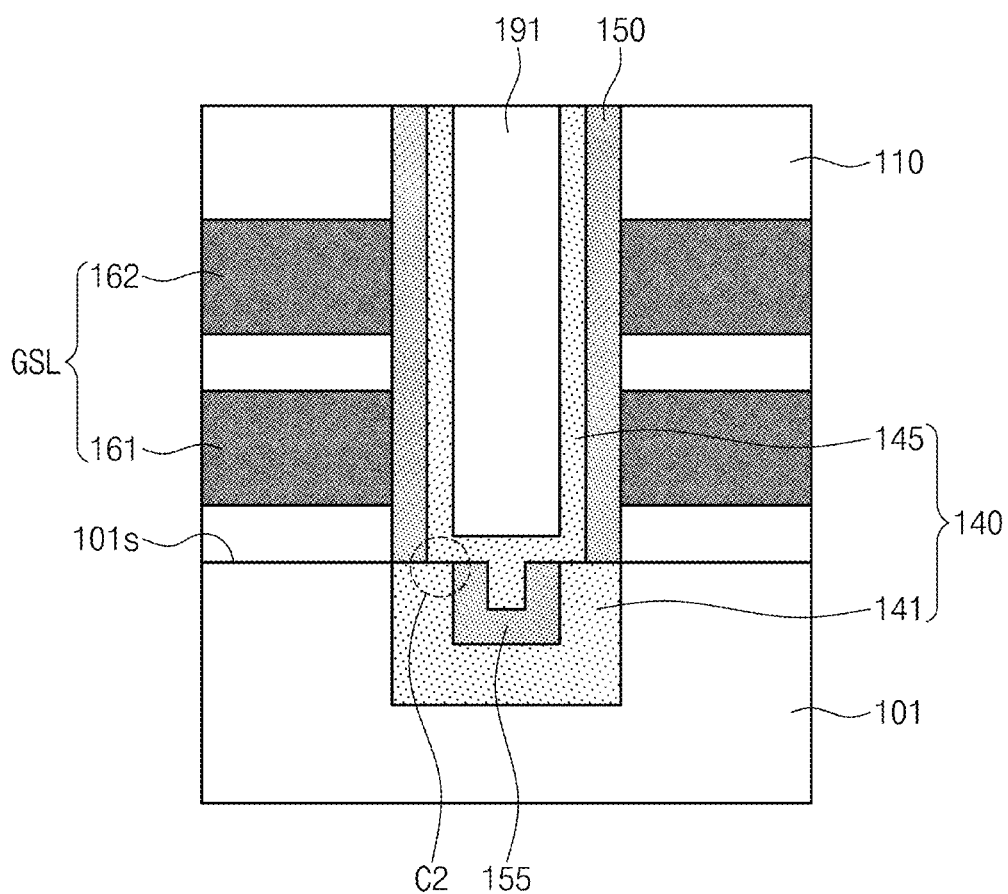

The upper channel 145 may, as illustrated in FIG. 5C, have a cylindrical shape whose top end is open and whose bottom end is closed. The upper channel 145 may also have a protrusion extending from the bottom of the closed end into the recess and filling a remainder of the recess left by the residual layer 155. Thus, the protrusion at the bottom of the upper channel 145 may be surrounded by the residual layer 155 and the lower channel 141 in the recess below the level of the top surface 101s of the substrate 101.

Figure 6A:
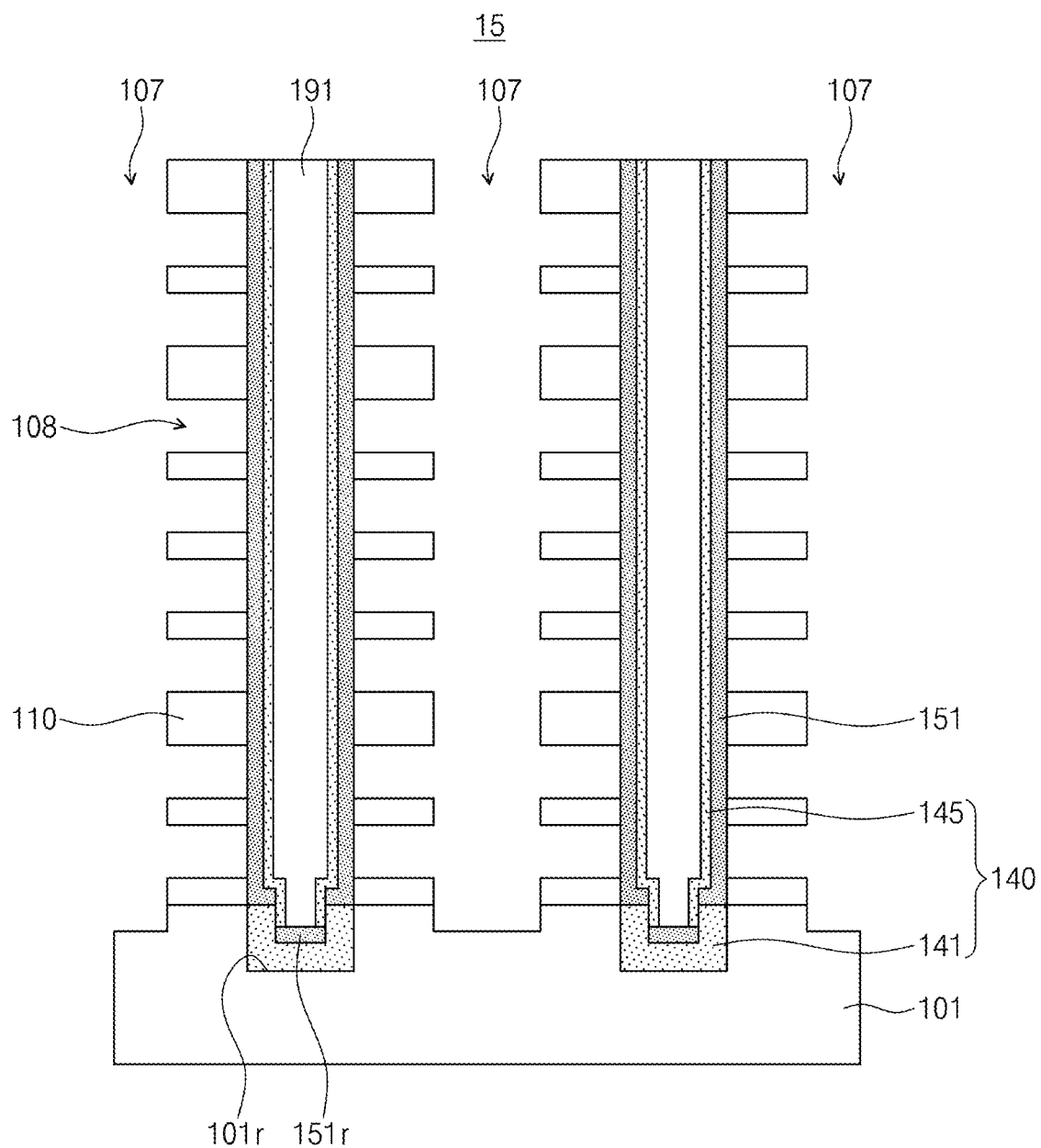
Figure 6B:
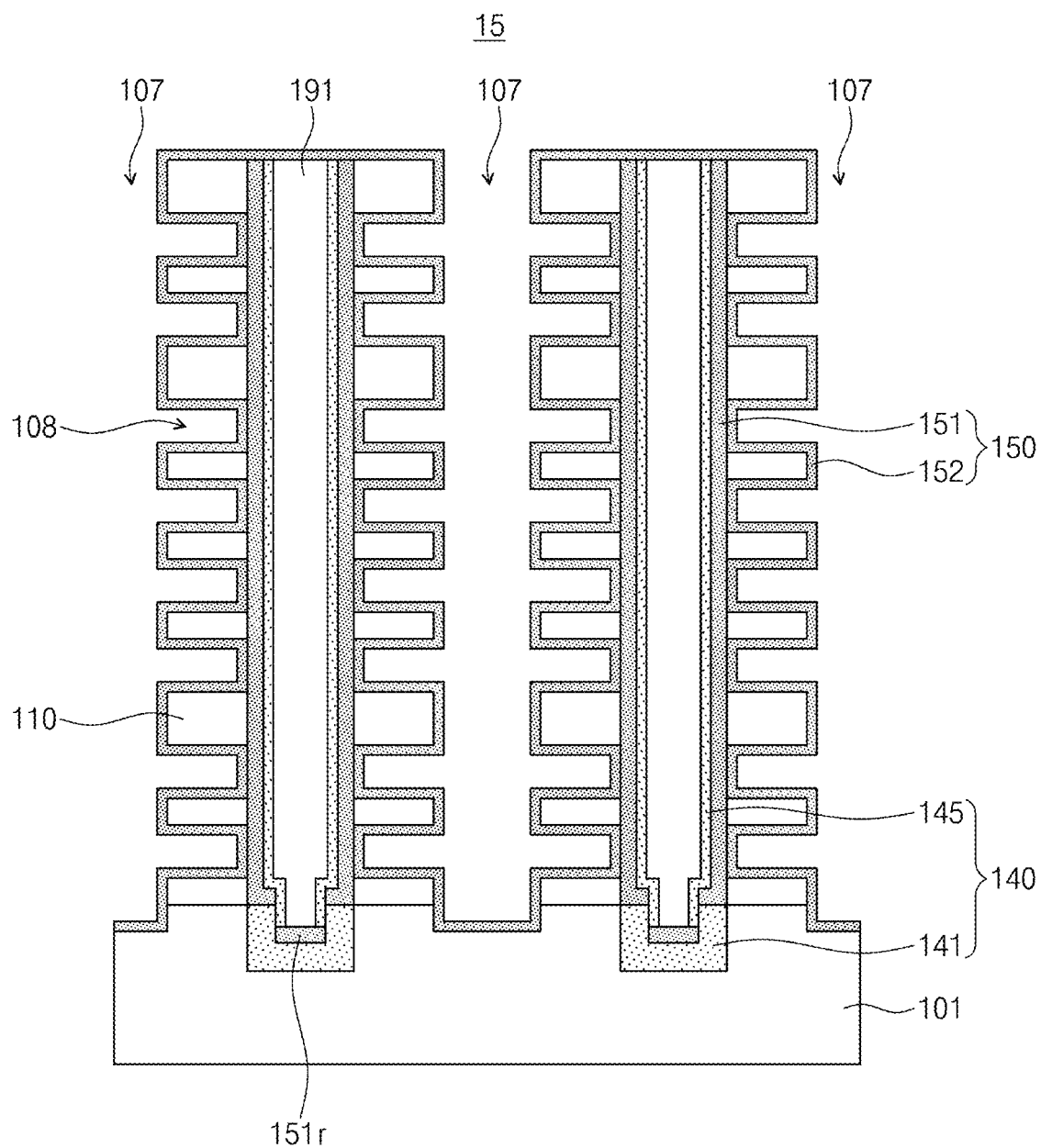
Figure 6C:
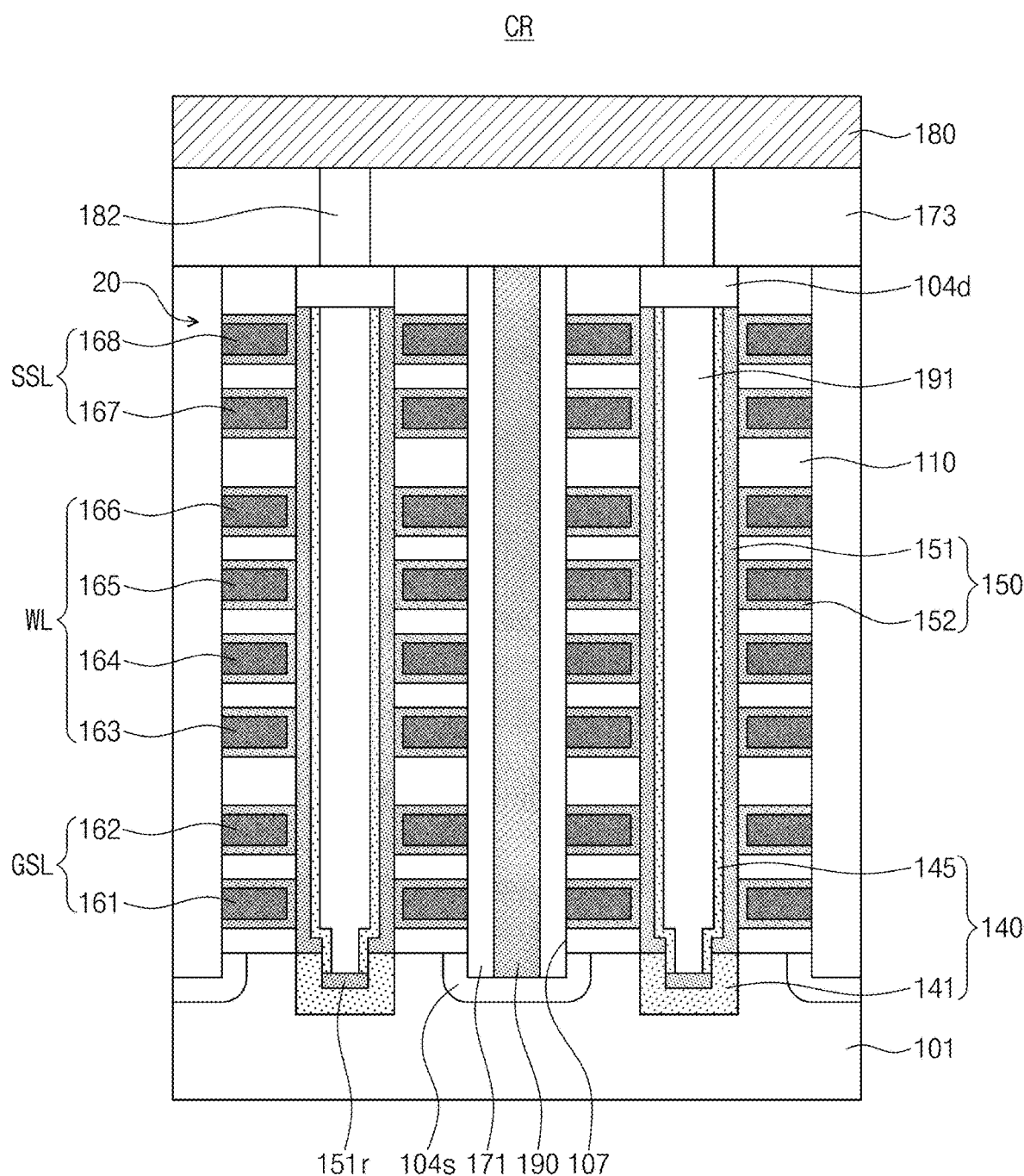
Figure 7A:
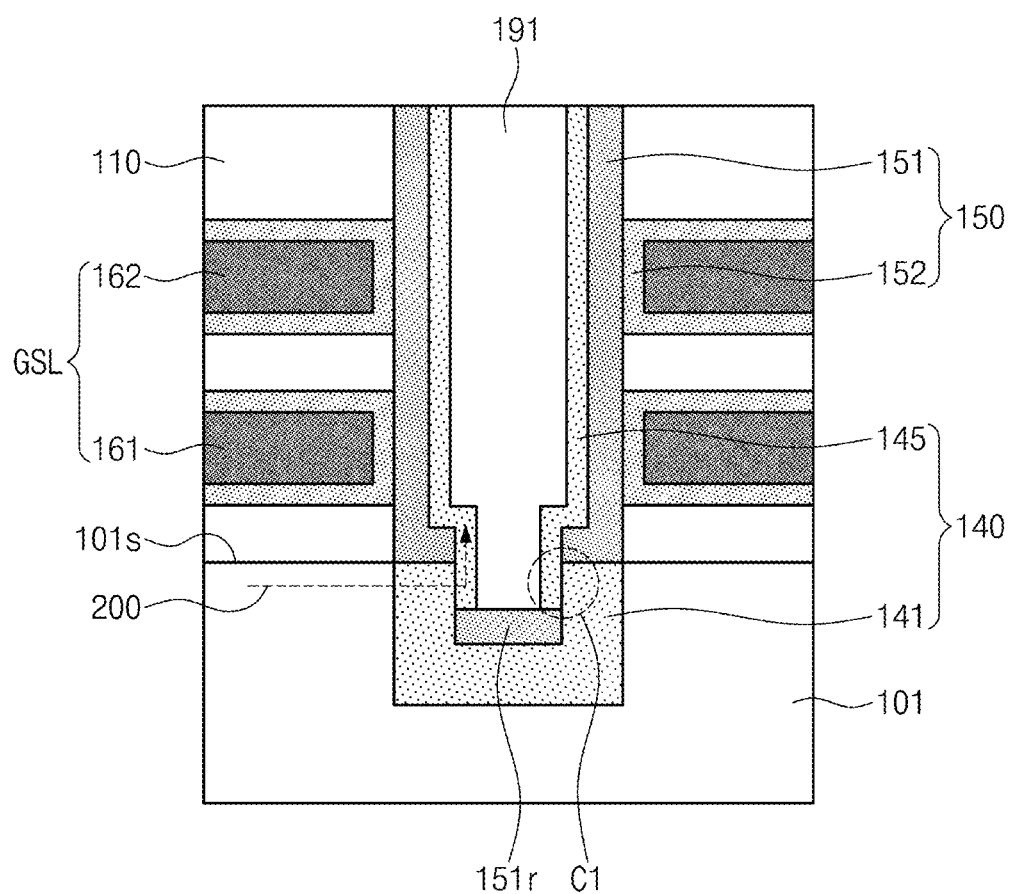
FIGS. 7A and 7B are enlarged cross-sectional views of different versions of a portion of the device shown in FIG. 6C.
Figure 7B:
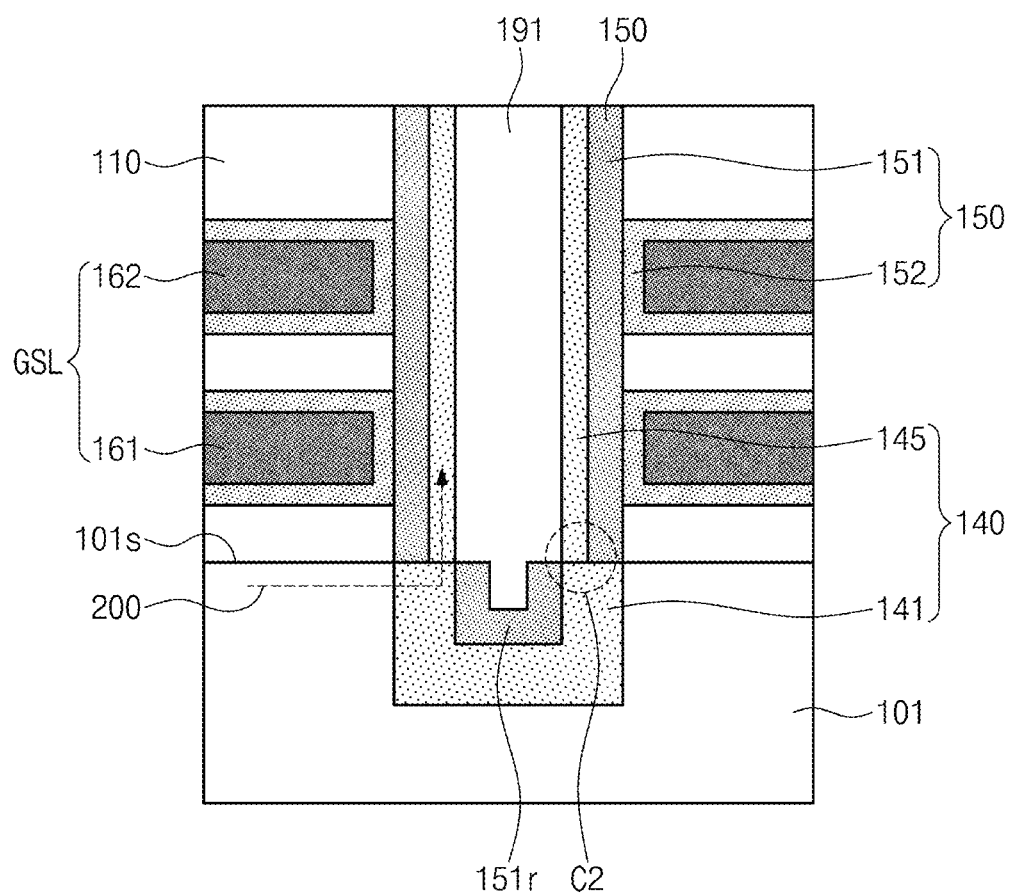

FIGS. 6A to 6C illustrate still anther examples of a method of fabricating a semiconductor memory device according to the present inventive concept. FIGS. 7A and 7B are enlarged cross-sectional views of different versions of a portion of the device shown in FIG. 6C.

Referring to FIG. 6A, processes substantially the same as those described above with reference to FIGS. 2A to 2M may be performed to form the mold wing 15. For example, instead forming the memory layer 150, a first memory layer 151 may be formed in the vertical hole 103 in the process described above with reference to FIGS. 2F and 2G. In this case, the recess 101r may be provided therein with a residual layer 151r of the first memory layer 151. When the mold wing 15 is formed, the first memory layer 151 may surround the upper channel 145 and may be exposed by the spaces 108. The first memory layer 151 may include the tunnel insulating layer, or the tunnel insulating layer and the trap insulating layer. The residual layer 151r may include the residual tunnel insulating layer, or the residual tunnel insulating layer and the residual trap insulating layer.

Referring to FIG. 6B, a second memory layer 152 may be formed to cover surfaces delimiting the spaces 108. When the first memory layer 151 includes the tunnel insulating layer, the second memory layer 152 may include the trap insulating layer and the blocking insulating layer. Alternatively, when the first memory layer 151 includes the tunnel insulating layer and the trap insulating layer, the second memory layer 152 may include the blocking insulating layer. The first and second memory layers 151 and 152 may in combination form the memory layer 150.

Referring to FIG. 6C, processes substantially the same as those described above with reference to FIGS. 2N to 2P may be performed to form the cell region CR. The variations shown in and described above with reference to FIGS. 3A to 3E and 5A to 5C may be applied to the cell region CR of the present example. For example, as illustrated in FIG. 7A, the cell region CR may provide the minimized current path 200 and the lateral connection structure C1 that provides a sufficient area for the current flow. As another example, as illustrated in FIG. 7B, the cell region CR may have the upward connection structure C2.

According to the present inventive concept, the lower and upper channels may form the connection structure providing a sufficient area for the current flow, and a minimized current path (conductive path of minimal length) may be achieved, with the result that the semiconductor memory device may have improved electrical characteristics. In examples of the present inventive concept, the connection structure includes an interface along which the upper channel and the lower channel meet and across which the conductive path is established in the device. Furthermore, at least one end of the interface is located no higher than a plane that coincides with the top surface of the substrate on which the gate stack is provided.

Furthermore, the lower channel may be formed using a low temperature process, and thus the thermal budget may not be exceeded. In particular, in fabricating the COP type semiconductor memory device, the thermal budget may be adhered to so as to eliminate or minimize thermal damage to the peripheral region.

Finally, this detailed description of the present inventive concept should not be construed as limited to the examples set forth herein, and it is intended that the present inventive concept cover various combinations, modifications and variations of the examples described herein without departing from the spirit and scope of the inventive concept as defined by the appended claims.

What is claimed is:

1. A semiconductor memory device, comprising:
   a substrate having a top surface and a recess therein defining an opening in the top surface;
   a plurality of gates vertically stacked on the top surface of the substrate;
   a vertical channel occupying a vertical hole that extends vertically through the plurality of gates; and
   a memory layer in the vertical hole and surrounding the vertical channel,
   wherein the vertical channel comprise
   a lower channel confined to and occupying part of the recess, the lower channel having a bottom wall and a sidewall projecting upwardly from the bottom wall such that the lower channel has a vertical cross section in a form of an upwardly facing bracket and the sidewall of the lower channel has a top surface and an inner surface; and
   an upper channel vertically extending along the vertical hole, and
   wherein the top surface of the sidewall of the lower channel is an uppermost surface of the lower channel and is situated at a level no higher than that of the top surface of the substrate,
   the lower and upper channels constitute a connection structure having an interface along which the lower channel and the upper channel meet and through which a conductive path between the lower channel and the upper channel is established, the interface being situated no higher than the top surface of the substrate, and
   a residual layer of the memory layer is confined to the recess and surrounded by the sidewall of the lower channel.

2. The semiconductor memory device of claim 1, wherein an uppermost surface of the residual layer is situated no higher than a level of the top surface of the substrate.

3. The semiconductor memory device of claim 1, wherein the connection structure is a lateral connection structure in which the interface along which the upper channel and the lower channel meet coincides with a portion of an inner surface of the sidewall of the lower channel, said portion of the inner surface of the sidewall of the lower channel being situated below the top surface of the substrate.

4. The semiconductor memory device of claim 3, wherein the memory layer vertically extends along the vertical hole into contact with the top surface of the sidewall of the lower channel, each half of the memory layer on opposite sides of a vertical plane passing through an axial center of the memory layer having an L-shaped vertical cross section a leg of which extends horizontally parallel to the top surface of the substrate.

5. The semiconductor memory device of claim 4, wherein the upper channel has a crook alongside a portion of the memory layer where legs of each diametrical half of the memory layer meet, and the upper channel extends below the top surface of the substrate into contact with the portion of the inner surface of the sidewall of the lower channel.

6. The semiconductor memory device of claim 1, wherein the connection structure is an upward connection structure in which a portion of the top surface of the sidewall of the lower channel constitutes the interface along which the upper channel and the lower channel meet, said portion of the top surface of the sidewall of the lower channel being disposed at the same level as the top surface of the substrate.

7. The semiconductor memory device of claim 6, wherein the memory layer extends vertically along the vertical hole into contact with another portion of the top surface of the sidewall of the lower channel, or
each half of the memory layer on opposite sides of a vertical plane passing through an axial center of the memory layer has an L-shaped vertical cross section a leg of which extends horizontally parallel to the top surface of the substrate.

8. The semiconductor memory device of claim 7, wherein a bottommost portion of the upper channel only extends vertically into contact with said another portion of the top surface of the sidewall of the lower channel or the bottommost portion of the upper channel has a crook alongside a portion of the memory layer where legs of each diametrical half of the memory layer meet.

9. The semiconductor memory device of claim 1, wherein the substrate comprises one of a single crystalline silicon wafer and an impurity-doped polycrystalline silicon layer.

10. The semiconductor memory device of claim 1, wherein the top surface of the sidewall of the lower channel is a flat surface coplanar with the top surface of the substrate.

11. A semiconductor memory device, comprising:
a substrate having an uppermost surface;
a gate stack in which a plurality of gates are vertically stacked on the uppermost surface of the substrate;
an upper channel extending vertically through the gate stack;
a lower channel extending from the upper channel to below the uppermost surface of the substrate, the lower channel having a bottom wall and a sidewall projecting upwardly from the bottom wall such that the lower channel has a vertical cross section in a form of an upwardly facing bracket and the sidewall of the lower channel has a top surface and an inner surface;
a memory layer in the gate stack, surrounding the upper channel, and extending to a level not lower than the uppermost surface of the substrate; and
a residual layer disposed in the substrate, the residual layer being surrounded by the sidewall of the lower channel below the uppermost surface of the substrate,
wherein the top surface of the sidewall of the lower channel is an uppermost surface of the lower channel and is situated at a level no higher than that of the uppermost surface of the substrate, and
respective portions of the upper channel and the lower channel constitute a connection structure having an interface along which the upper channel and the lower channel meet such that the upper channel and the lower channel together form a vertical channel, the interface being situated at a level not higher than that of the uppermost surface of the substrate.

12. The semiconductor memory device of claim 11, wherein the substrate has a recess therein defining an opening in the uppermost surface of the substrate, the lower channel being disposed in the recess, and
wherein the residual layer is confined to the recess and surrounded by the lower channel, an uppermost surface of the residual layer being situated at a level no higher than a level of the uppermost surface of the substrate.

13. The semiconductor memory device of claim 11, wherein the memory layer is contact with the top surface of the sidewall of the lower channel,
the upper channel extends along the memory layer into contact with a portion of the inner surface of the sidewall of the lower channel below the uppermost surface of the substrate, and
the connection structure is a lateral connection structure in which the interface along which the upper channel and the lower channel meet coincides with said portion of the inner surface of the sidewall of the lower channel.

14. The semiconductor memory device of claim 11, wherein the memory layer is in contact with a portion of the top surface of the sidewall of the lower channel,
the upper channel extends along the memory layer into contact with another portion of the top surface of the sidewall of the lower channel, and
the connection structure is an upward connection structure in which the interface along which the upper channel and the lower channel meet coincides with said another portion of the top surface of the sidewall of the lower channel, said another portion of the top surface of the sidewall of the lower channel being disposed at the same level as that of the uppermost surface of the substrate.

15. The semiconductor memory device of claim 11, wherein a bottommost portion of the memory layer at the uppermost surface of the substrate only extends vertically in a direction perpendicular to a plane coinciding with the uppermost surface of the substrate or each half of the bottommost portion of the memory layer, on opposite sides of a vertical plane passing through an axial center of the memory layer, and has an L-shaped cross section, and
the upper channel extends conformally alongside the bottommost portion of the memory layer.

16. A semiconductor memory device, comprising:
a substrate having a top surface;
a gate stack including gates disposed one above another on the top surface of the substrate;
a vertical channel having an upper portion of semiconductor material and a lower portion of semiconductor material;
a memory layer structure in the gate stack; and
a residual layer disposed below the top surface of the substrate,
wherein the upper portion of the vertical channel extends vertically through the gate stack,
the memory layer structure surrounds the upper portion of the vertical channel,
the lower portion of the vertical channel is disposed in the substrate, the lower portion of the vertical channel having a form of a pot so as to have a bottom wall and a sidewall projecting upwardly from the bottom wall, the sidewall having a top surface in the form of a rim and an inner surface,
the residual layer is surrounded by the sidewall, and
the upper portion of the vertical channel and the lower portion of the vertical channel have an interface along which an outer surface of the upper portion of the vertical channel and an inner surface of the lower portion of the vertical channel contact each other and across which a conductive path is established in the device, at least one end of the interface being located no higher than a plane that coincides with the top surface of the substrate.

17. The semiconductor memory device of claim 16, wherein the interface is the only interface along which the upper portion of the vertical channel and the lower portion of the vertical channel meet,
  the interface extends no higher than a plane level with the top surface of the substrate, and
  at least part of the inner surface of the sidewall of the lower portion of the vertical channel constitutes the interface.

18. The semiconductor memory device of claim 16, wherein the interface is the only interface along which the upper portion of the vertical channel and the lower portion of the vertical channel contact each other,
  the interface extends no higher than a plane level with the top surface of the substrate, and
  part of the top surface of the lower portion of the vertical channel constitutes the interface.

19. The semiconductor memory device of claim 16, wherein the interface is the only interface along which the upper portion of the vertical channel and the lower portion of the vertical channel contact each other,
  the interface extends no higher than a plane level with the top surface of the substrate, and
  at least part of the inner surface of the sidewall of the lower portion of the vertical channel and part of the top surface of the lower portion of the vertical channel constitute the interface.

20. The semiconductor memory device of claim 16, wherein the top surface of the lower portion of the vertical channel is convex.

* * * * *